United States Patent
Kondo

(10) Patent No.: US 10,545,191 B2
(45) Date of Patent: Jan. 28, 2020

(54) LOAD SYSTEM, LOAD TEST DEVICE, AND COMMUNICATION TERMINAL

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD., Tokyo (JP)

( * ) Notice: Subject to any disclaimer, the term of this patent is extended or adjusted under 35 U.S.C. 154(b) by 0 days.

(21) Appl. No.: 16/453,870

(22) Filed: Jun. 26, 2019

(65) Prior Publication Data

US 2019/0317148 A1 Oct. 17, 2019

Related U.S. Application Data

(63) Continuation of application No. PCT/JP2017/018277, filed on May 16, 2017.

(51) Int. Cl.
*G01R 31/34* (2006.01)
*G01R 1/02* (2006.01)

(52) U.S. Cl.
CPC .............. *G01R 31/34* (2013.01); *G01R 1/025* (2013.01)

(58) Field of Classification Search
None
See application file for complete search history.

(56) References Cited

U.S. PATENT DOCUMENTS 4,357,574 A 11/1982 Takamisawa et al.
9,488,694 B2* 11/2016 Kondo .................. G01R 31/40

| | | |
|---|---|---|
| 2007/0033455 A1 | 2/2007 | Wagner et al. |
| 2010/0007327 A1* | 1/2010 | Andoh ............. G01R 31/31924 324/76.11 |
| 2016/0252579 A1* | 9/2016 | Kondo .................. G01R 31/40 324/764.01 |

FOREIGN PATENT DOCUMENTS

| JP | S55-167171 U | 12/1980 |
|---|---|---|
| JP | 2000-162291 A | 6/2000 |
| JP | 2005-160130 A | 6/2005 |
| JP | 2010-025752 A | 2/2010 |
| JP | 2013-102612 A | 5/2013 |
| WO | 2014/162678 A1 | 10/2014 |

(Continued)

OTHER PUBLICATIONS

International Search Report issued in PCT/JP2017/018277 dated Aug. 15, 2017 with English Translation (5 pages).

(Continued)

*Primary Examiner* — Jermele M Hollington
(74) *Attorney, Agent, or Firm* — Nakanishi IP Associates, LLC

(57) ABSTRACT

A load system includes a first load test device, and a communication terminal that performs wireless communication with the first load test device. The first load test device includes a first communication unit that performs wireless communication with the communication terminal. The first communication unit transmits information related to an on/off state of the first load test device to the communication terminal, and receives a signal related to an instruction for operating the first load test device from the communication terminal.

7 Claims, 16 Drawing Sheets

(56) References Cited

FOREIGN PATENT DOCUMENTS

WO    WO-2017134768 A1 *  8/2017   ............. G01R 31/34

OTHER PUBLICATIONS

Notification of Reasons for Refusal issued in Japanese Patent Application No. 2017-555414, dated Jan. 5, 2018, with English Translation (6 pages).
Office Action issued in Korean Patent Application No. 10-2019-7023006 dated Nov. 4, 2019, with English Translation (11 pages).
Written Opinion of International Searching Authority issued in PCT/JP2017/018277 dated Aug. 15, 2017, with English Translation (12 pages).

* cited by examiner

Fig. 1
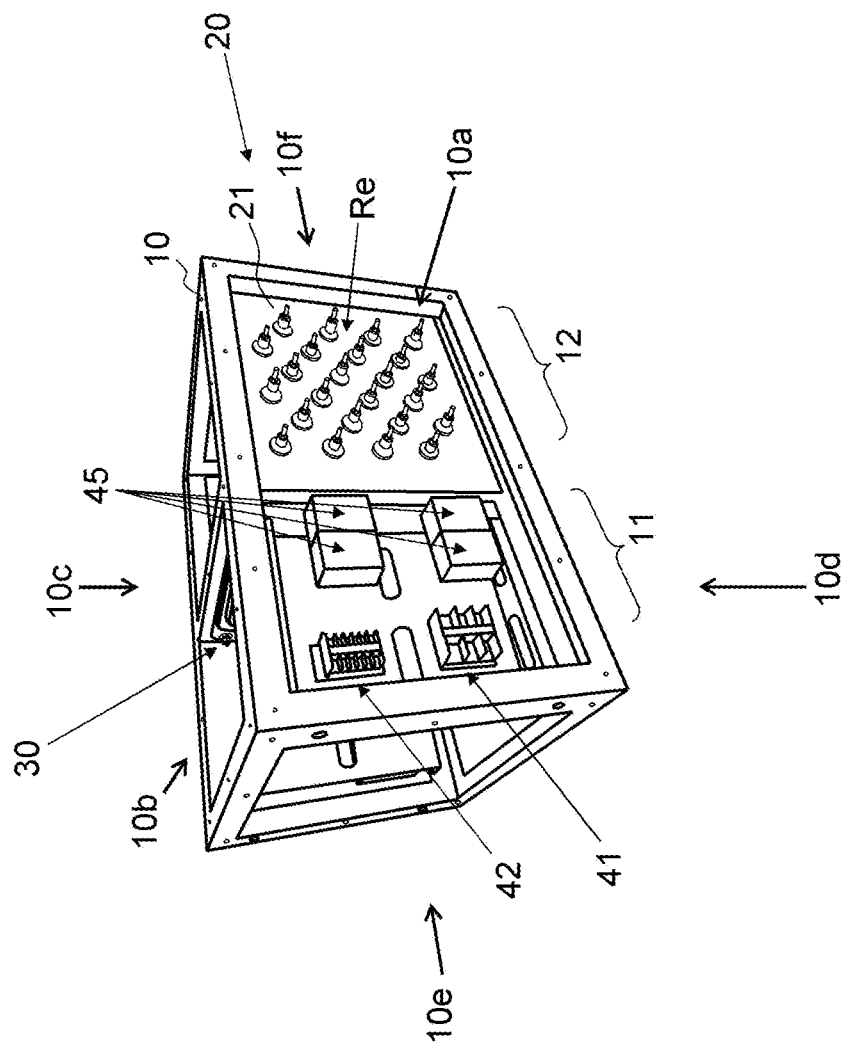
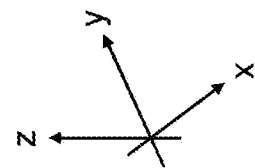

LOAD SYSTEM, LOAD TEST DEVICE, AND COMMUNICATION TERMINAL

This application is a continuation application of International Patent Application No. PCT/JP2017/018277 filed on May 16, 2017, the entire content of which is incorporated by reference.

TECHNICAL FIELD

The present invention relates to a load system, and the like.

BACKGROUND ART

In the related art, as in Patent Literature 1, a dry-type load test device that performs a load test of a generator is suggested.

CITATION LIST

Patent Literature

Patent Literature 1: JP 2010-25752 A

SUMMARY OF INVENTION

Technical Problem

However, an operator who is at a position remote from a load test device cannot grasp a state of the load test device and cannot operate the load test device.

Therefore, one or more embodiments of the present invention provide a load system in which an operator who is at a remote position can grasp a state of a load test device or can operate the load test device, and the like.

Solution to Problem

One or more embodiments of the present invention includes a first load test device and a communication terminal that performs wireless communication with the first load test device. The first load test device includes a first communication unit that performs wireless communication with the communication terminal. The first communication unit transmits information related to an on/off state of the first load test device to the communication terminal, and receives a signal related to an instruction for operating the first load test device from the communication terminal.

Since the communication terminal that can perform communication with the load test device, an operator who is at a position remote from the load test device can grasp a state of the load test device, or can operate the load test device.

Preferably, software configured to display an on/off state display pattern is installed in the communication terminal. The on/off state display pattern includes a relay on/off state display region that shows an on/off state of a relay in the first load test device, and a load test state display region that shows a load test state of the first load test device. Switching of the on/off state of the relay in the first load test device is performed in correspondence with an operation of the relay on/off state display region.

More preferably, the first load test device includes a first resistance unit in which a plurality of resistor groups including resistors is provided. When communication between the first communication unit and the communication terminal is cut off, at least one of the relays among the first load test device, which correspond to the plurality of resistor groups in the first resistance unit and are set to an on-state, is set to an off-state.

In a case where communication between the communication unit and the communication terminal is cut off, it is difficult to control a load state and the like of the load test device through an operation by the communication terminal, but it is possible to secure safety of the load test device by lowering a load on the basis of the communication cutting-off.

In addition, preferably, the first load test device includes a first resistance unit in which a plurality of resistor groups including resistors is provided. When communication between the first communication unit and the communication terminal is cut off, several relays among the first load test device, which correspond to the plurality of resistor groups in the first resistance unit and are set to an on-state, are gradually set to an off-state.

More preferably, in a case where the communication is recovered after the communication is cut off, and before all of the relays corresponding to the plurality of resistor groups in the first load test device are set to the off-state, the gradual setting control to the off-state is stopped, and the communication terminal displays information related to the communication recovery.

A load system according to one or more embodiments of the present invention includes a first load test device, a second load test device that is different from the first load test device, and a communication terminal that performs wireless communication with the first load test device and the second load test device. The first load test device includes a first communication unit that performs wireless communication with the communication terminal. The second load test device includes a second communication unit that performs wireless communication with the communication terminal. The first communication unit transmits information related to an on/off state of the first load test device to the communication terminal, and receives a signal related to an instruction for operating the first load test device from the communication terminal. The second communication unit transmits information related to an on/off state of the second load test device to the communication terminal, and receives a signal related to an instruction for operating the second load test device from the communication terminal.

The communication terminal performs communication with the plurality of load test devices 1, and the plurality of load test devices is operated. Accordingly, states of the plurality of load test devices can be simultaneously displayed on one piece of communication terminal, and one operator can operate the plurality of load test devices.

Particularly, this configuration is effective for a load test of an air-conditioning facility which is performed by providing the plurality of load test devices 1.

Preferably, software configured to display a first on/off state display pattern and a second on/off state display pattern is installed in the communication terminal. The first on/off state display pattern includes a first relay on/off state display region that shows an on/off state of a relay in the first load test device, and a first load test state display region that shows a load test state of the first load test device. The second on/off state display pattern includes a second relay on/off state display region that shows an on/off state of a relay in the second load test device, and a second load test state display region that shows a load test state of the second load test device. Switching of the on/off state of the relay in the first load test device is performed in correspondence with an operation of the first relay on/off state display region. Switching of the on/off state of the relay in the second load test device is performed in correspondence with an operation of the second relay on/off state display region. The load test state of the first load test device includes at least one piece of information among information related to a current, information related to a voltage, information related to electric power, information related to a load amount, information related to a test time, and information indicating whether or not an operation is performed normally in the load test of the first load test device. The load test state of the second load test device includes at least one piece of information among information related to a current, information related to a voltage, information related to electric power, information related to a load amount, information related to a test time, and information related to whether or not an operation is performed normally in the load test of the second load test device.

More preferably, the first load test device includes a first resistance unit in which a plurality of resistor groups including resistors is provided. The second load test device includes a second resistance unit in which a plurality of resistor groups including resistors is provided. When communication between the first communication unit and the communication terminal is cut off, at least one of the relays among the first load test device, which correspond to the plurality of resistor groups in the first resistance unit and are set to an on-state, is set to an off-state. When communication between the second communication unit and the communication terminal is cut off, at least one of the relays among the second load test device, which correspond to the plurality of resistor groups in the second resistance unit and are set to an on-state, is set to an off-state.

In addition, preferably, the software is configured to further display a history display pattern. The history display pattern includes an in-progress display region that shows a load test state of the first load test device and a load test state of the second load test device, and a past display region that shows a past load test content in the first load test device and the second load test device. The past load test content in the past display region includes information related to date and time in the past load test. In a case where a region that shows the load test state of the first load test device in the in-progress display region is operated, switching to display of the first on/off state display pattern is performed. In a case where a region that shows the load test state of the second load test device in the in-progress display region is operated, switching to display of the second on/off state display pattern is performed.

A load test device according to one or more embodiments of the present invention includes a first communication unit that performs wireless communication with a communication terminal. The first communication unit transmits information related to an on/off state of the load test device to the communication terminal, and receives a signal related to an instruction for operating the load test device from the communication terminal.

A communication terminal according to one or more embodiments of the present invention performs wireless communication with a first load test device. The first load test device includes a first communication unit that performs wireless communication with the communication terminal. The communication terminal receives information related to an on/off state of the first load test device from the first communication unit, and transmits a signal related to an instruction for operating the first load test device to the first communication unit.

As described above, according to one or more embodiments of the invention, it is possible to provide a load system in which an operator who is at a remote position can grasp a state of a load test device or can operate the load test device, and the like.

BRIEF DESCRIPTION OF DRAWINGS

FIG. 1 is a perspective view of a load test device according to an embodiment before a protective cover and the like are attached.

DESCRIPTION OF EMBODIMENTS

Figure 2:
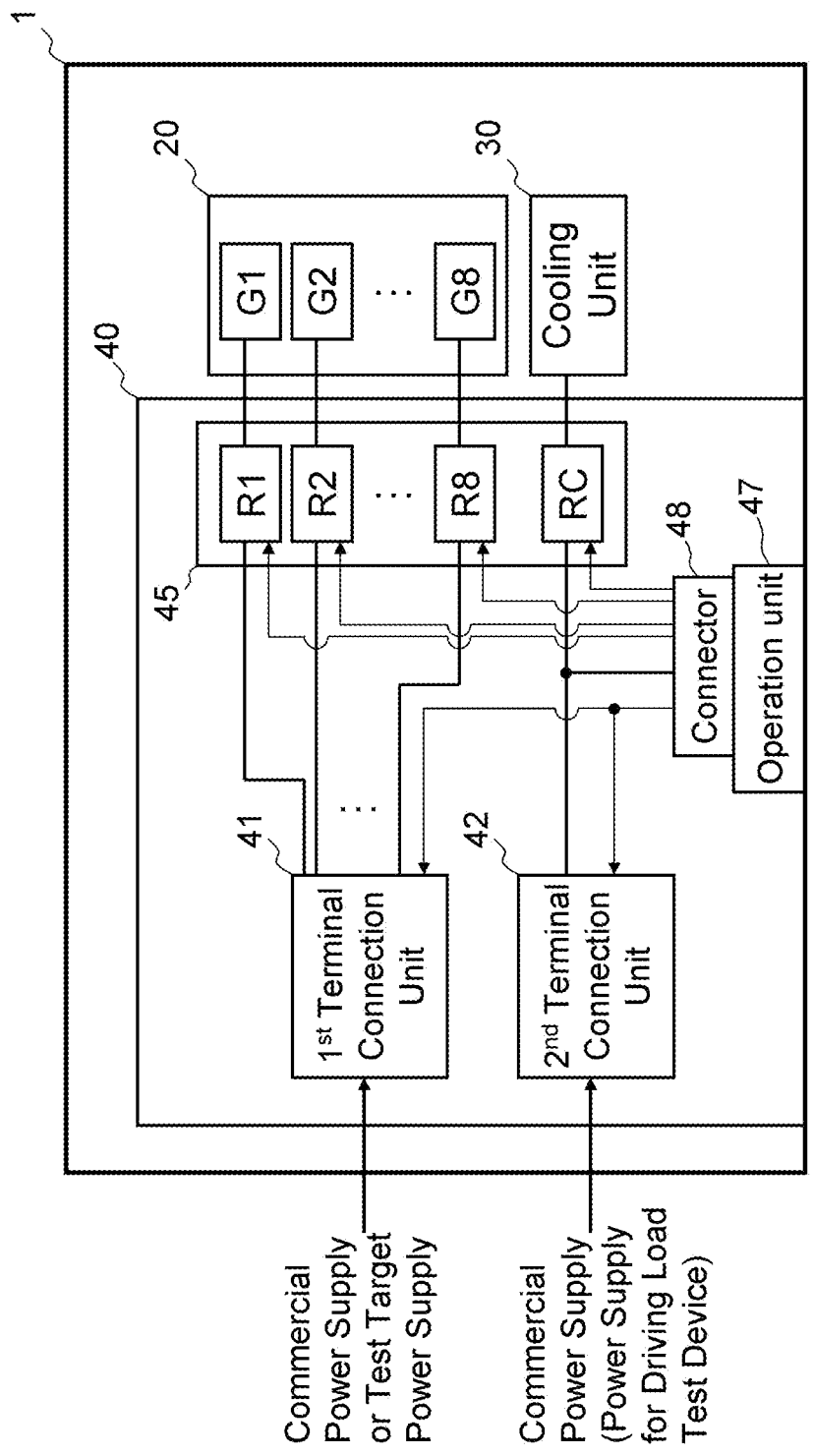
FIG. 2 is a schematic view illustrating a configuration of the load test device.

Hereinafter, an embodiment will be described with reference to the accompanying drawings. A dry-type load test device 1 according to this embodiment includes a housing 10, a resistance unit 20, a cooling unit 30, a connection switching unit 40, and an installation member 50 (FIG. 1 to FIG. 9).

In the following description, a direction in which a resistor Re of the resistance unit 20 extends is set as an x-direction, a direction which is orthogonal to the x-direction and in which the resistance unit 20 and the cooling unit 30 are arranged in parallel is set as a y-direction, and a direction that is orthogonal to the x-direction and the y-direction is set as a z-direction.

In a first embodiment (a first load test that is a load test of an air-conditioning facility that cools down a computer server, refer to FIG. 1 to FIG. 6), the x-direction and the y-direction become a horizontal direction, and the z-direction becomes a vertical direction.

In a second embodiment (a second load test that is a load test of a generator or a battery, refer to FIG. 1 to FIG. 3, and FIG. 7 to FIG. 9), the x-direction and the z-direction become a horizontal direction, and the y-direction becomes a vertical direction).

An external shape of the housing 10 is set to a rectangular parallelepiped. One of yz-planes orthogonal to the x-direction in the rectangular parallelepiped is set as a first side surface 10a, and the other yz-plane is set as a second side surface 10b. One of xy-planes orthogonal to the z-direction in the rectangular parallelepiped is set as an upper surface 10c, and the other xy-plane is set as a lower surface 10d. One of xz-planes orthogonal to the y-direction in the rectangular parallelepiped is set as a front surface 10e, and the other xz-plane is set as a rear surface 10f. A side close to the front surface 10e is set as a first region 11, and a side close to the rear surface 10f is set as a second region 12.

The lower surface 10d becomes a bottom surface in the first embodiment, and the front surface 10e becomes a bottom surface in a second embodiment.

The housing 10 accommodates the cooling unit 30 in the first region 11, and accommodates the resistance unit 20 in the second region 12.

A first terminal connection unit 41, a second terminal connection unit 42, and a relay unit 45 are provided in the first side surface 10a or the second side surface 10b in the first region 11 of the housing 10.

Particularly, the first terminal connection unit 41 and the second terminal connection unit 42 are provided on a side closer to the front surface 10e in comparison to a position to which a rack attachment bracket 51 is attached.

An operation unit 47 is attached to the front surface 10e of the housing 10 or the upper surface 10c in the first region 11 of the housing 10 in a detachable state.

Covers 13 (a first side surface cover 13a, a second side surface cover 13b, an upper surface cover 13c, and a lower surface cover 13d), which cover a resistor Re that constitutes the resistance unit 20, a cable or a short-circuit bar that is connected to a terminal of the resistor Re, and a holding plate 21 that holds the resistor Re, are provided in the first side surface 10a, the second side surface 10b, the upper surface 10c, and the lower surface 10d in the second region 12 of the housing 10.

The covers 13 are formed from a conductive material such as iron and aluminum.

In addition, at least the front surface 10e, the rear surface 10f, and the upper surface 10c and the lower surface 10d of the first region 11 are opened to allow cold air from the cooling unit 30 to collide with the resistance unit 20 and to be exhausted from the rear surface 10f.

With regard to the first side surface 10a and the second side surface 10b, it is preferable to provide a region opened to a side other than a region to which the first terminal connection unit 41 and the like are attached so as to efficiently perform air-intake.

In a case of the first load test, air-intake of a cooling fan of the cooling unit 30 is performed by mainly using regions of openings of the upper surface 10c and the lower surface 10d in the first region 11 and a region of an opening of the front surface 10e to which the operation unit 47 is not attached, and exhaustion of the cooling fan of the cooling unit 30 is performed by using an opening of the rear surface 10f.

In a case of the second load test, air-intake of the cooling fan of the cooling unit 30 is performed by mainly using the regions of the openings of the upper surface 10c and the lower surface 10d in the first region 11 to which the operation unit 47 is not attached, and the opening of the front surface 10e, and exhaustion of the cooling fan of the cooling unit 30 is performed by using the opening of the rear surface 10f.

The rack attachment bracket 51 is attached to the first side surface 10a and the second side surface 10b in the first region 11 of the housing 10, and the load test device 1 is attached to a server rack 90 through the rack attachment bracket 51.

The server rack 90 typically holds a computer server, and holds the load test device 1 instead of the computer server in the first load test.

A width of the housing 10 (a distance between the first side surface 10a and the second side surface 10b) is shorter than a width of the server rack 90 to attach the load test device 1 to the server rack 90.

Particularly, in a case where the server rack 90 is a 19-inch rack, the width of the housing 10 and the like are set so that a width between the rack attachment bracket 51 attached to the first side surface 10a of the housing 10 and the rack attachment bracket 51 attached to the second side surface 10b of the housing 10 (a distance between holes which are attached to the server rack 90) becomes 19 inches (approximately 480 mm).

In the resistance unit 20, resistor rows, in which a plurality of rod-shaped resistors Re parallel to the x-direction is arranged in parallel with a predetermined interval in the z-direction, are arranged in parallel in a plurality of stages in the y-direction, and the resistance unit 20 is used to perform a load test (the first load test or the second load test).

In the first load test (first embodiment) of an air-conditioning facility that cools down the computer server, the first terminal connection unit 41 is connected to the same commercial power supply that supplies electric power to the computer server, and the resistors Re is supplied with electric power from the commercial power supply.

In the second load test (the second embodiment) of a generator or a battery, the first terminal connection unit 41 is connected to a test target power supply (the generator or the battery), and the resistors Re is supplied with electric power from the test target power supply.

In this embodiment, six stages of the resistor rows, in which four pieces of the resistors Re arranged in parallel in the z-direction, are arranged in parallel in the y-direction. However, the number of the resistors Re which are arranged in parallel in each of the resistor rows, or the stages of the resistor rows which stack each other is not limited thereto.

In the resistors Re which constitute the resistance unit 20, a group in which a plurality of the adjacent resistors Re is connected to each other in series or in parallel is set as one resistor group, and the load test is performed while changing the number of the resistor groups which performs voltage application from the commercial power supply (first embodiment) or the test target power supply (second embodiment).

The resistance unit 20 includes a first resistor group G1 to an eighth resistor group G8. However, the number of the resistor groups G is not limited to the above-described configuration.

A terminal of each of the resistors Re is connected to a terminal of another resistor Re with a short-circuit bar, or the first terminal connection unit 41 or the relay unit 45 through a cable.

Figure 6:
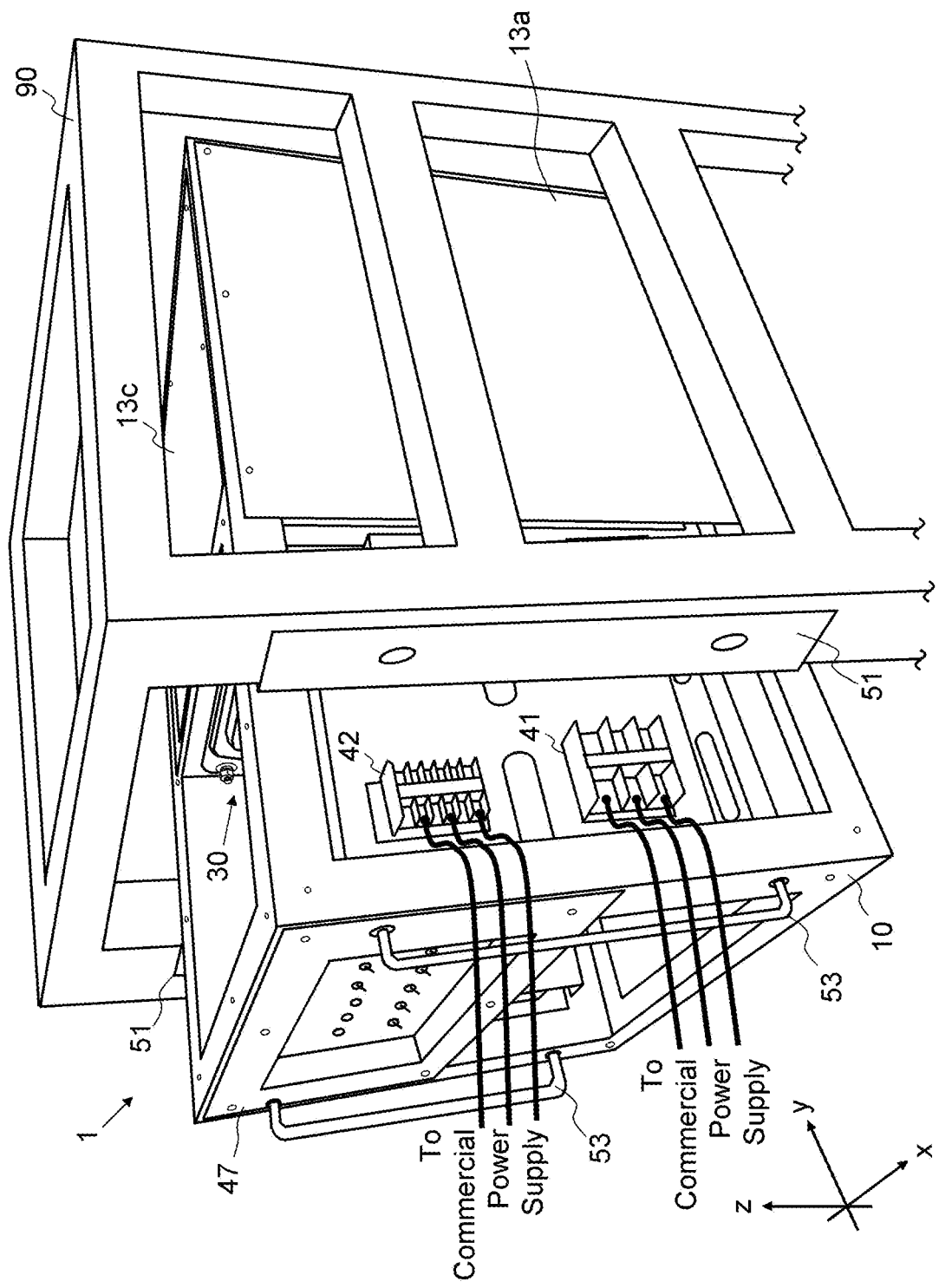
FIG. 6 is a perspective view of the load test device in a state of being attached to a server rack.
Figure 7:
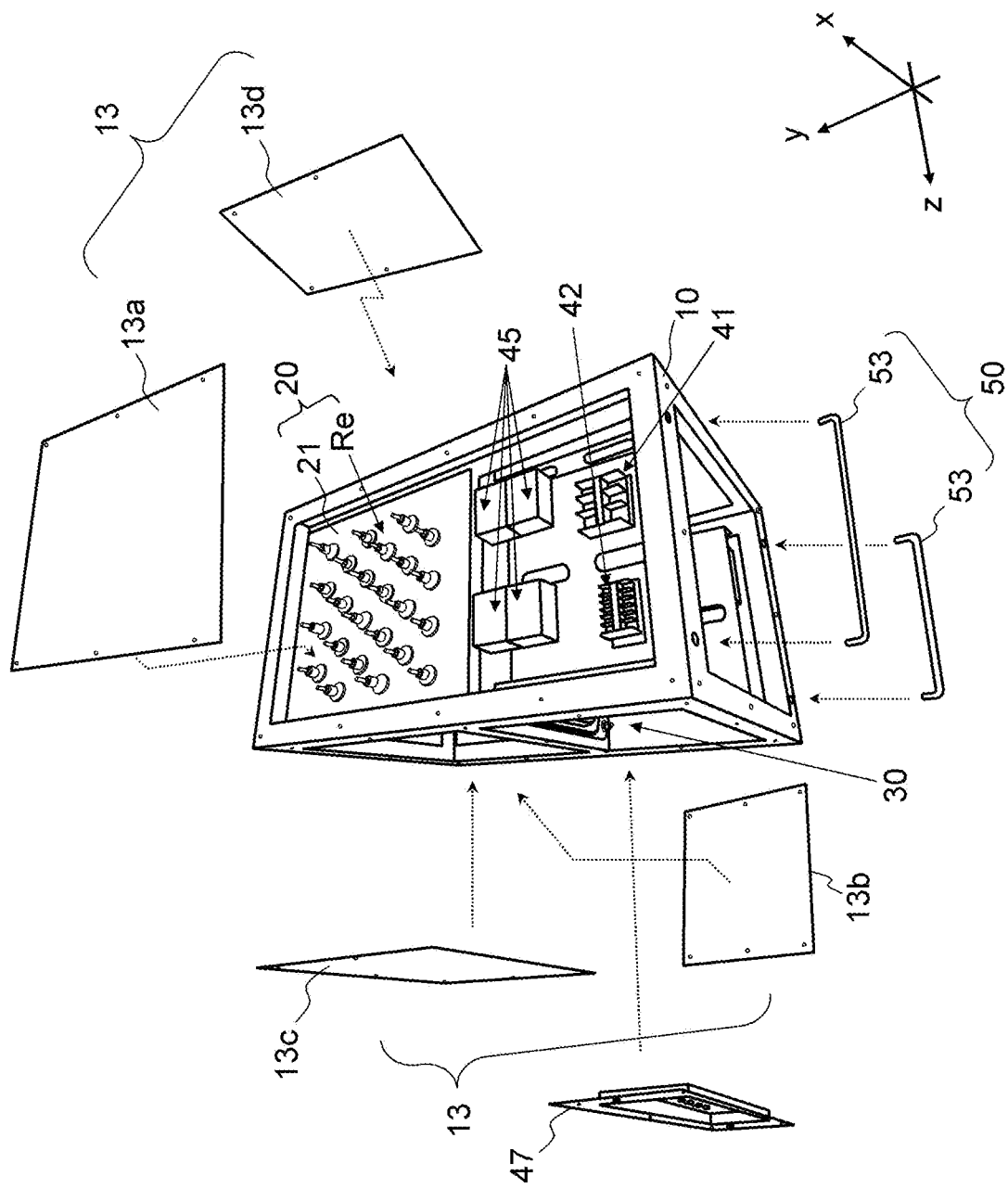
FIG. 7 is a perspective view of the load test device before a protective cover and the like for a second load test are attached.
Figure 8:
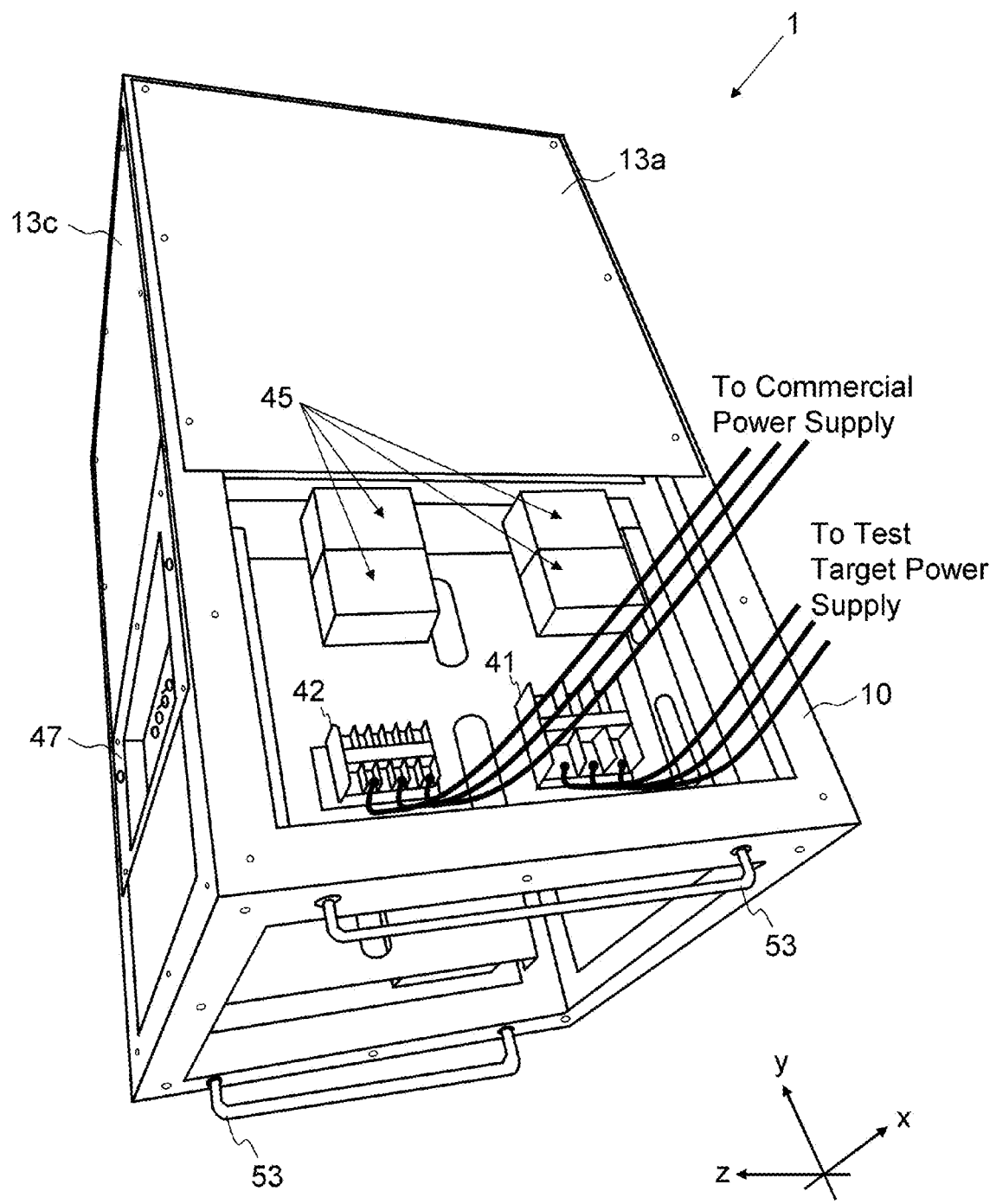
FIG. 8 is a perspective view of the load test device after the protective cover and the like for the second load test are attached.

However, the short-circuit bar and the cable except for a cable that connects the first terminal connection unit 41 and the commercial power supply and a cable that connects the second terminal connection unit 42 and the commercial power supply in FIG. 6, and the short-circuit bar and the cable except for a cable that connects the first terminal connection unit 41 and the test target power supply and a cable that connects the second terminal connection unit 42 and the commercial power supply in FIG. 8 are not illustrated.

A site that is not electrically conducted to a terminal in the resistor Re is held by a wall that constitutes the holding plate 21.

It is preferable that a portion that is a terminal of the resistor Re, and protrudes and is exposed from the wall that constitutes the holding plate 21 is covered with a cap (not illustrated) that is constituted by an insulating member such as a rubber.

To perform cooling by the cooling unit 30 with efficiency, the resistors Re of the resistor rows are arranged so that at an intermediate position between a resistor Re which constitutes resistor row and a resistor Re adjacent to the resistor Re in the z-direction, a resistor Re of resistor row adjacent to the resistor row in the y-direction is arranged.

The cooling unit 30 includes a cooling fan that cools down the resistors Re of the resistance unit 20 by using air that is taken from an outer side.

The cooling fan is driven by using the commercial power supply (power supply for driving the load test device) (refer to FIG. 2).

It is preferable that the cooling fan is attached to the first region 11 of the housing 10 in a detachable state such as screwing.

In this case, it is possible to transport the cooling fan of the cooling unit 30 and the operation unit 47 individually from the housing 10 and the like of the load test device 1, and it is possible to attach the cooling unit 30 and the operation unit 47 to the housing 10 and the like in the field in which the load test is performed.

Particularly, attachment and detachment of the cooling fan of the cooling unit 30 can be easily performed in a state in which the operation unit 47 is removed from the housing 10 (at least, a state in which the operation unit 47 is removed from the upper surface 10c or the lower surface 10d of the housing 10).

The load test device 1 can perform a load test (first embodiment) in a state in which the cooling unit 30 and the resistance unit 20 are installed to be disposed in a horizontal direction, and a load test (second embodiment) in a state in which the cooling unit 30 and the resistance unit 20 are installed to be disposed in a vertical direction.

Exhausting of cooling air that is fed from the cooling unit 30 to the resistance unit 20 is performed from the rear surface 10f of the housing 10.

The connection switching unit 40 includes the first terminal connection unit 41, the second terminal connection unit 42, the relay unit 45, and the operation unit 47 (refer to FIG. 2 to FIG. 4, and FIG. 7).

The first terminal connection unit 41 is a terminal for cable connection with the commercial power supply (first embodiment) or the test target power supply of a generator and the like (second embodiment). Through the first terminal connection unit 41, the commercial power supply (first embodiment) or the test target power supply (second embodiment), and the resistor groups (the first resistor group G1 to the eighth resistor group G8) which constitute the resistance unit 20 enter a state capable of being connected to each other.

The cable connection between the first terminal connection unit 41 and the commercial power supply (first embodiment) or the test target power supply (second embodiment) is performed through a space between the front surface 10e and a region in which the rack attachment bracket 51 is attached in the opening of the first side surface 10a (refer to FIG. 6).

It is preferable that a circuit breaker such as a vacuum circuit breaker (VCB) is provided between the first terminal connection unit 41 and the relay unit 45, or in the first terminal connection unit 41.

The second terminal connection unit 42 is a terminal for cable connection with the commercial power supply. Through the second terminal connection unit 42, the commercial power supply and the cooling fan of the cooling unit 30, the commercial power supply and a relay of the relay unit 45, and the commercial power supply and the operation unit 47 enter a state capable of being connected to each other.

However, in the second load test, the second terminal connection unit 42 may also be connected to the test target power supply, and the cooling fan of the cooling unit 30, the relay of the relay unit 45, or the operation unit 47 may be driven with electric power that is supplied from the test target power supply.

The cable connection between the second terminal connection unit 42 and the commercial power supply is performed through a space between the front surface 10e and a region in which the rack attachment bracket 51 is attached in the opening of the first side surface 10a (refer to FIG. 6).

It is preferable that a circuit breaker such as a molded case circuit breaker (MCCB) is provided between the second terminal connection unit 42 and the relay unit 45, or in the second terminal connection unit 42.

The relay unit 45 includes a relay (a cooling fan relay RC) that performs on/off control of electric power supply to the cooling unit 30 in correspondence with a switch operation of the operation unit 47, and relays (a first relay R1 to an eighth relay R8) which perform on/off control of electric power supply to the resistor groups (the first resistor group G1 to the eighth resistor group G8) which constitute the resistance unit 20 in correspondence with the switch operation of the operation unit 47.

Figure 3:
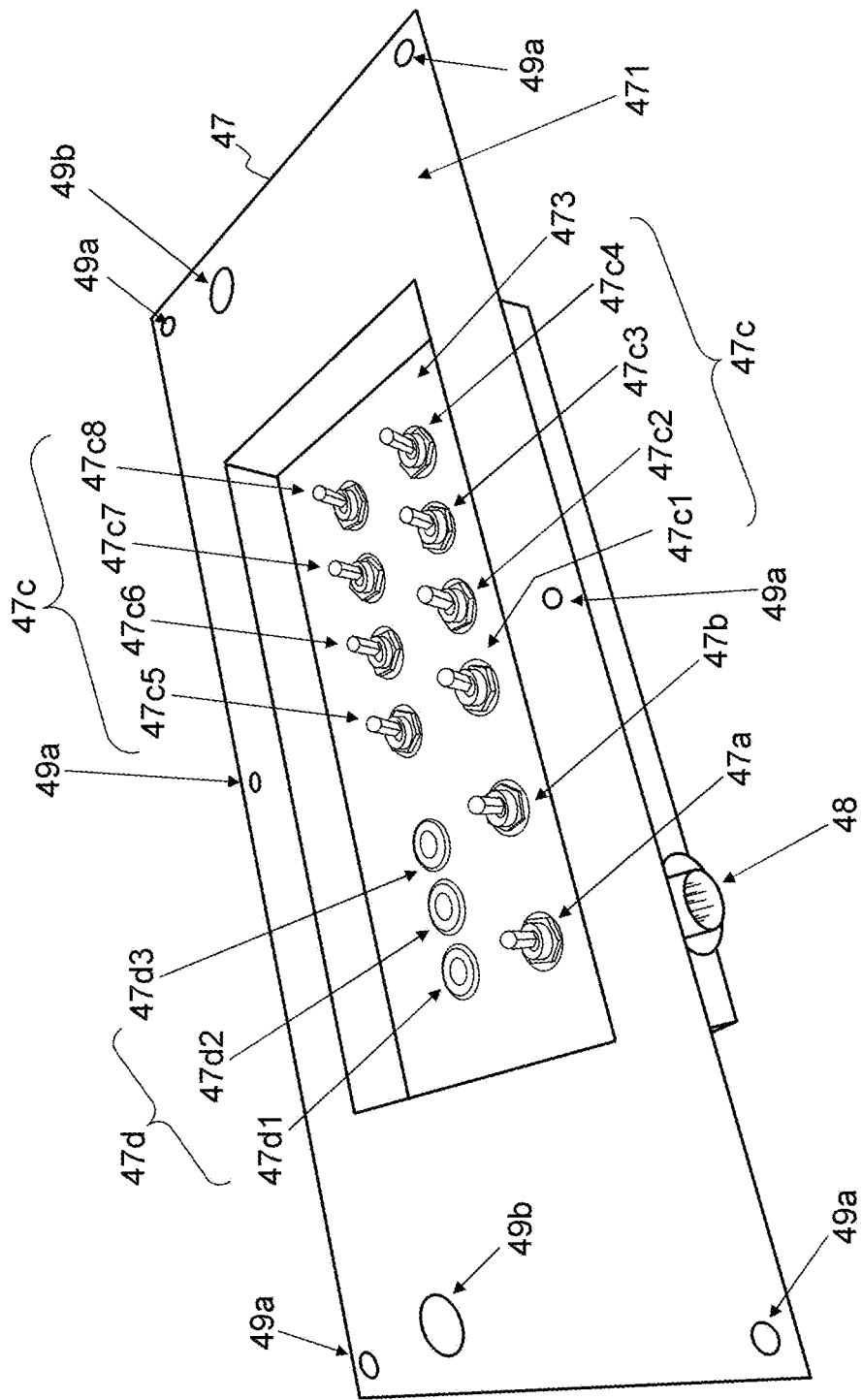
FIG. 3 is a perspective view of an operation unit.
Figure 4:
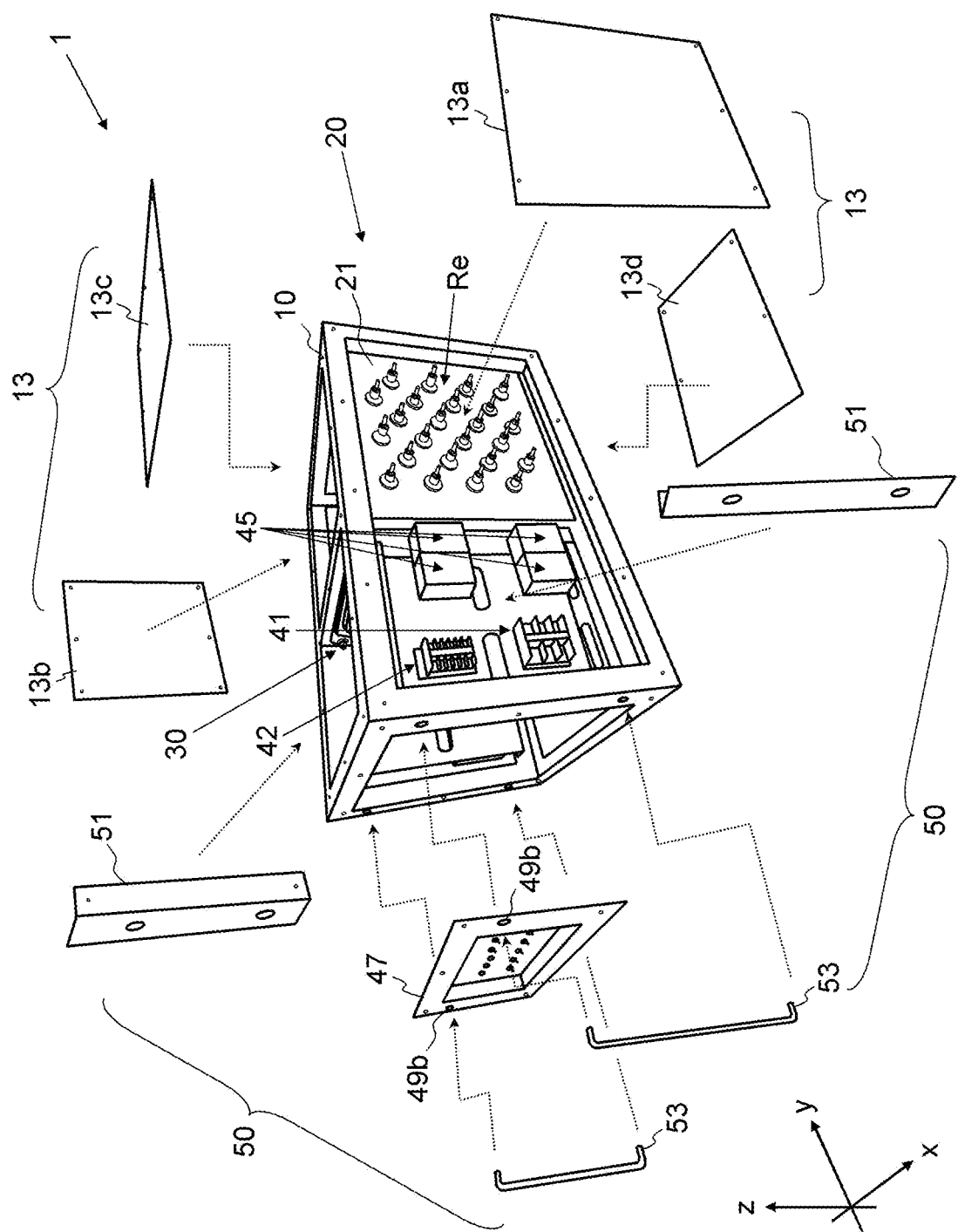
FIG. 4 is a perspective view of the load test device before the protective cover and the like for a first load test are attached.
Figure 5:
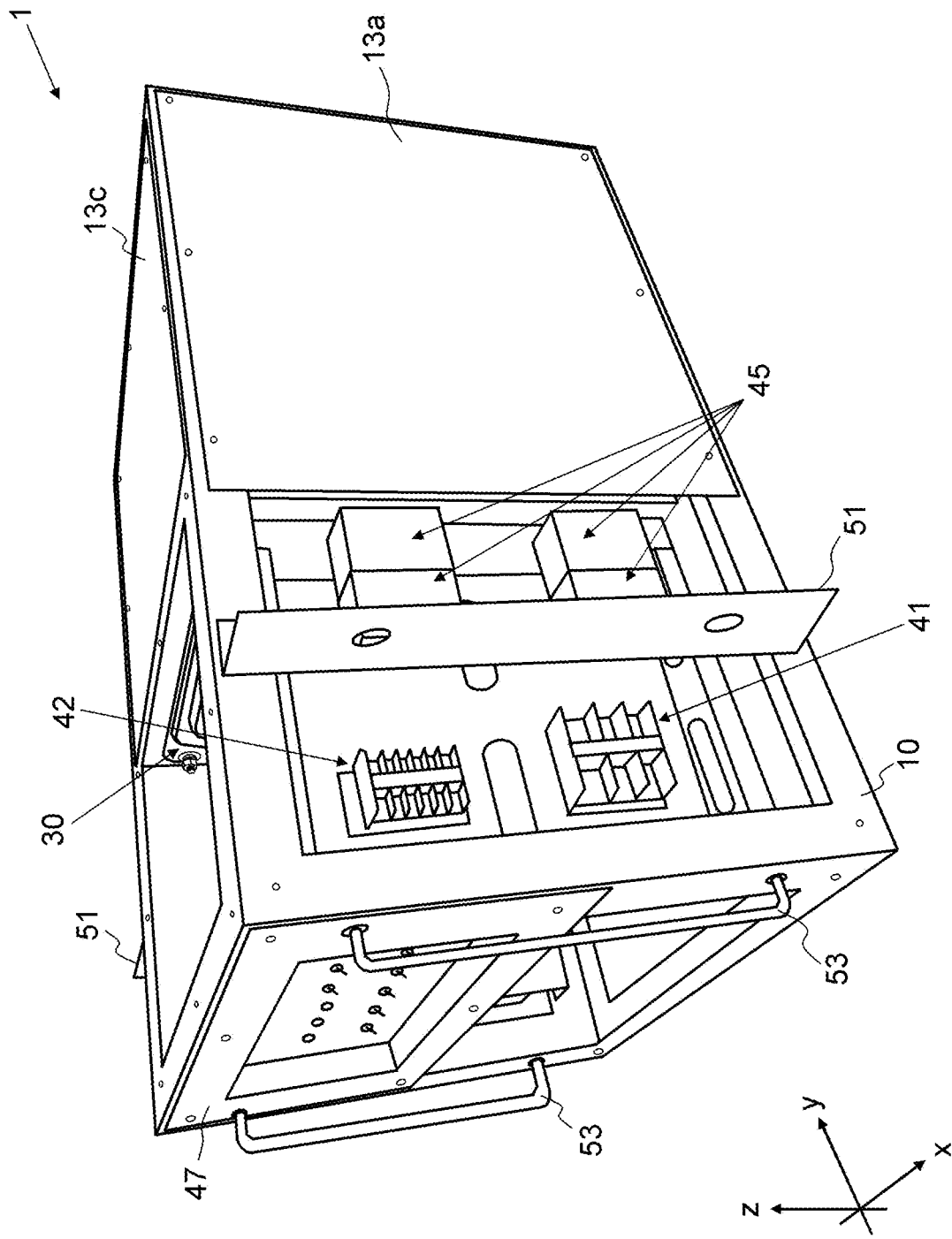
FIG. 5 is a perspective view of the load test device after the protective cover and the like for the first load test are attached.

The relays (the cooling fan relay RC, and the first relay R1 to the eighth relay R8) which constitutes the relay unit 45 are driven by using the commercial power supply (power supply for driving the load test device) (refer to FIG. 2 and FIG. 3).

The operation unit 47 includes a power switch 47a, a cooling fan switch 47b, a resistance switching switch 47c, and a display unit 47d (refer to FIG. 3).

The power switch 47a is a sliding-type (or toggle-type or press button-type) operation switch and is used to select on/off of the load test device 1.

When the power switch 47a enters an on-state, a circuit breaker of the first terminal connection unit 41 or a relay (not illustrate) enters an on-state, and thus it enters a state in which a current from the commercial power supply (first embodiment) or the test target power supply (second embodiment) which is connected to the load test device 1 through the first terminal connection unit 41 can flow to the first relay R1 to the eighth relay R8 of the relay unit 45.

In addition, when the power switch 47a enters the on-state, a circuit breaker of the second terminal connection unit 42 or a relay (not illustrated) enters an on-state, and thus it enters a state in which a current from the commercial power supply that is connected to the load test device 1 through the second terminal connection unit 42 can flow to the cooling fan relay RC in the relay unit 45 and the operation unit 47.

The cooling fan switch 47b is a sliding-type (or a toggle-type or a press button-type) operation switch, and is used to select on/off of the cooling fan of the cooling unit 30 (to switch modes).

When the cooling fan switch 47b enters an on-state, the cooling fan relay RC enters an on-state, and thus it enters a state in which a current from the commercial power supply that is connected to the load test device 1 through the second terminal connection unit 42 can flow to the cooling fan of the cooling unit 30.

The resistance switching switch 47c (a first resistance switching switch 47c1 to an eighth resistance switching switch 47c8) is a sliding-type (a toggle-type or a press button-type) operation switch, and is a switch for performing on/off control of the relays (the first relay R1 to the eighth relay R8) of the relays of the first resistor group G1 to the eighth resistor group G8.

When the first resistance switching switch 47c1 enters an on-state, the relay (the first relay R1) of the first resistor group G1 enters an on-state, and thus it enters a state in which a current from the commercial power supply (first embodiment) or the test target power supply (second embodiment) which is connected to the load test device 1 through the first terminal connection unit 41 can flow to the first resistor group G1.

Similarly, when any one of the second resistance switching switch 47c2 to the eighth resistance switching switch 47c8 enters an on-state, a relay of a corresponding resistor group enters an on-state, and thus it enters a state in which a current from the commercial power supply (first embodiment) or the test target power supply (second embodiment) which is connected to the load test device 1 through the first terminal connection unit 41 can flow to the corresponding resistor group.

The display unit 47d is a display device that shows an operation state of the load test device 1, and includes a first lighting unit 47d1 that is lighted during a normal operation, a second lighting unit 47d2 that is lighted during alarm, and a third lighting unit 47d3 that is lighted during operation stoppage due to abnormality.

In addition, the display unit 47d may display a numerical value of a current that flows the first resistor group G1 to the eighth resistor group G8, a voltage that is applied to the first resistor group G1 to the eighth resistor group G8, an electric power value, a load amount, a test time, and the like, or an operation state indicating whether or not an operation is performed normally, and the like.

The operation unit 47 is attached to the front surface 10e of the housing 10 (first embodiment), or the upper surface 10c in the first region 11 of the housing 10 (may be the lower surface 10d, second embodiment) in a detachable state.

Attachment of the operation unit 47 to the housing 10 is performed with screwing through a first attachment hole 49a formed in a housing 471, and the like.

The operation unit 47 is attached in the first region 11 of the housing 10 and is attached to the front surface 10e parallel to the rear surface 10f (first embodiment). Or, the operation unit 47 is attached in the first region 11 of the housing 10 and is attached to any one of the upper surface 10c, the lower surface 10d, and the side surfaces (the first side surface 10a and the second side surface 10b) which are orthogonal to the front surface 10e.

In a case where the operation unit 47 is attached to any one of the openings of the upper surface 10c, the lower surface 10d, and the side surfaces (the first side surface 10a and the second side surface 10b), intake of cooling air is performed by using at least an opening in the front surface 10e (second embodiment).

In a case where the operation unit 47 is attached to the front surface 10e, intake of the cooling air is performed by using at least one of the openings of the upper surface 10c, the lower surface 10d, and the side surfaces (the first side surface 10a and the second side surface 10b), in the first region 11 (first embodiment).

In this embodiment, the operation unit 47 may be attached to not only one site but also two or more sites (the front surface 10e and the upper surface 10c (or the lower surface 10d, the first side surface 10a, and the second side surface 10b)) in a detachable state.

Accordingly, even when the load test device 1 is installed so that the resistance unit 20 and the cooling unit 30 are disposed in a horizontal direction, or the load test device 1 is installed so that the resistance unit 20 and the cooling unit 30 are disposed in a vertical direction, it is possible to easily perform an operation.

The operation unit 47 includes a concave portion 473 that is further recessed in comparison to the housing 471, and the power switch 47a, the cooling fan switch 47b, the resistance switching switch 47c, and the display unit 47d are provided in the concave portion 473 so that the power switch 47a and the like do not protrude from the front surface 10e or the upper surface 10c when the operation unit 47 is attached to the housing 10.

A connector 48 is provided to a rear surface (a side opposite to a front side in which the power switch 47a and the like are provided) of the concave portion 473, and electric connection between the power switch 47a and the first terminal connection unit 41 or the second terminal connection unit 42, between the cooling fan switch 47b and the cooling fan relay RC, between the first resistance switching switch 47c1 and the first relay R1, and the like are performed through the connector 48.

Electric wiring of the operation unit 47 can be easily performing by attachment and detachment through the connector 48.

Furthermore, in addition to the first attachment hole 49a, a second attachment hole 49b is provided in the housing 471.

The installation member 50 includes the rack attachment bracket 51 and a knob 53.

The rack attachment bracket 51 has an L-shape, one surface that constitutes the L-shape is attached to the first side surface 10a and the second side surface 10b of the housing 10 through screwing and the like, and the other surface that constitutes the L-shape is attached to the server rack 90 through screwing and the like (first embodiment).

The load test device 1 is attached to the server rack 90 in such a manner that apart (the front surface 10e and the like) of the first region 11 protrudes from the server rack 90. The first terminal connection unit 41 and the second terminal connection unit 42 are disposed in the first region 11 on a side that is closer to the front surface 10e in comparison to a position attached to the server rack 90 (position to which the rack attachment bracket 51 is attached) in the side surface (the first side surface 10a or the second side surface 10b) of the housing 10.

In the second embodiment, the rack attachment bracket 51 is not used.

The knob 53 has a lateral U-shape, and is provided at two or more sites.

In the first embodiment in which the operation unit 47 is attached to the front surface 10*e* of the housing 10, the knob 53 is attached to the front surface 10*e* through the second attachment hole 49*b*, and is used for attachment and detachment of the load test device 1 to the server rack 90.

In the second embodiment in which the operation unit 47 is attached to the upper surface 10*c* in the first region 11 of the housing 10, the knob 53 is attached to the front surface 10*e* not through the second attachment hole 49*b*, and is used to provide a constant interval between the front surface 10*e* of the housing 10 which becomes a bottom surface and an installation surface to which the load test device 1 is attached for air-intake.

Figure 9:
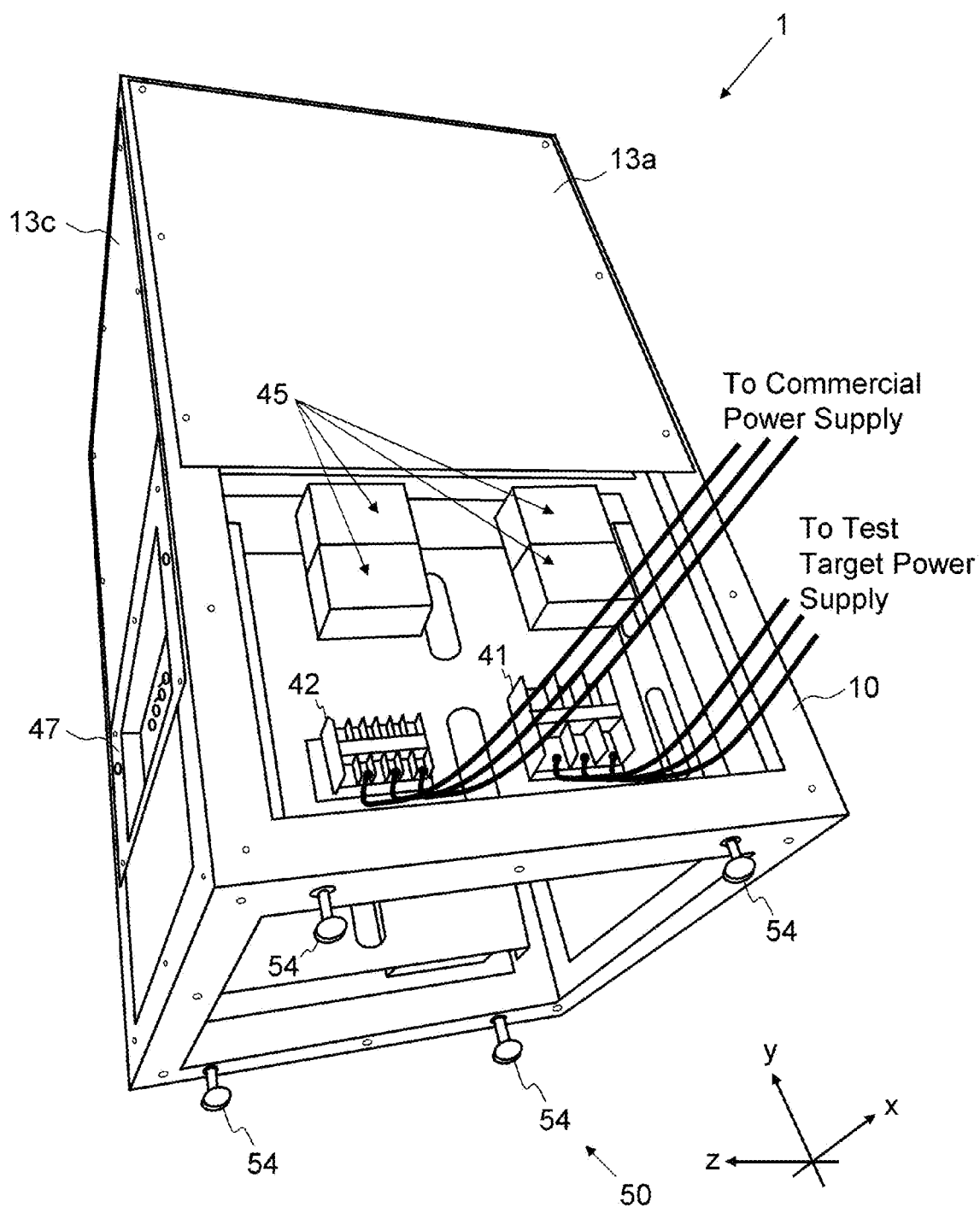
FIG. 9 is a perspective view of the load test device after the protective cover and the like for the second load test are attached, and a caster is attached instead of a knob in FIG. 8.

However, in the second embodiment, four or more casters 54 may be attached to the front surface 10*e* instead of the two or more knobs 53 having the lateral U-shape (refer to FIG. 9). In this case, the casters 54 is used to provide a constant interval between the front surface 10*e* of the housing 10 which becomes a bottom surface and an installation surface to which the load test device 1 is attached for air-intake.

In a case of performing the first load test that is a load test of an air-conditioning facility that cools down the computer server, the load test device 1 is installed so that the cooling unit 30 and the resistance unit 20 are disposed in a horizontal direction, electric power from the commercial power supply is supplied to the resistor groups (the first resistor group G1 to the eighth resistor group G8) through the first terminal connection unit 41 and the relay unit 45 (the first relay R1 to the eighth relay R8), the side surfaces (the first side surface 10*a* and the second side surface 10*b*) of the housing 10 are attached to the server rack 90 that holds the computer server, the operation unit 47 is attached to the front surface 10*e* of the housing 10, air-intake is performed by using at least one of the opening of the front surface 10*e*, the opening of the upper surface 10*c* in the first region 11, and the opening of the lower surface 10*d* in the first region 11, and exhaustion is performed from the rear surface 10*f* of the housing 10 in a horizontal direction.

In a case of performing the second load test that is a load test of the test target power supply including a generator or a battery, the load test device 1 is installed so that the cooling unit 30 is disposed on a lower side and the resistance unit 20 is disposed on an upper side, the knobs 53 (or the casters 54) are used to provide a constant interval between the front surface 10*e* and an installation surface to which the load test device 1 is attached, electric power from the test target power supply is supplied to the resistor groups (the first resistor group G1 to the eighth resistor group G8) through the first terminal connection unit 41 and the relay unit 45 (the first relay R1 to the eighth relay R8), the operation unit 47 is attached to the upper surface 10*c* or the lower surface 10*d* of the housing 10, air-intake is performed by using at least one of the opening of the front surface 10*e*, the opening of the upper surface 10*c* in the first region 11, and the opening of the lower surface 10*d* in the first region 11, and exhaustion is performed from the rear surface 10*f* toward an upward direction.

In the first load test, the load test device 1 is attached to the server rack 90 in which the computer server is installed, electric power is supplied to the resistance unit 20 of the load test device 1 by using the commercial power supply for driving the computer server, an air-conditioning device of a chamber in which the computer server is installed is operated under a situation in which the amount of heat generation and the like is the same as in driving of the computer server, and it is confirmed whether or not cooling capability of the air-conditioning device is sufficient.

At this time, the load test device 1 is installed to the server rack 90 in the same manner as in the computer server.

In the air-conditioning facility, a blowing direction and the like are set in consideration of a position of a cooling target such as the computer server. Accordingly, when using the load test device 1 that performs the same heat generation at a position at which the computer server is installed and at the amount of heat generation from the computer server, it is possible to perform a load test (the first load test) of the air-conditioning device in a state closer to an environment in which an actual computer server is operated.

The first terminal connection unit 41 and the second terminal connection unit 42 that perform cable connection with the commercial power supply are disposed on a side that is closer to the front surface 10*e* in comparison to a position, to which the rack attachment bracket 51 is attached, on the first side surface 10*a*, and are located at a position that protrudes from the server rack 90. Accordingly, it is possible to easily perform the cable connection even after attaching the load test device 1 to the server rack 90.

In addition, the operation unit 47 can be attached to not only the front surface 10*e* but also another surface (here, the upper surface 10*c*). Accordingly, it is possible to perform not only a load test in an installation aspect in which exhaustion is performed in a horizontal direction as in the first embodiment, but also a load test (second load test) in an installation aspect in which exhaustion is performed to an upward direction as in the second embodiment.

At this time, it is possible to provide a gap for receiving cooling air between the front surface 10*e* that constitutes the bottom surface of the housing 10, and the installation surface of the load test device 1 due to the knobs 53 or the casters 54.

Figure 10:
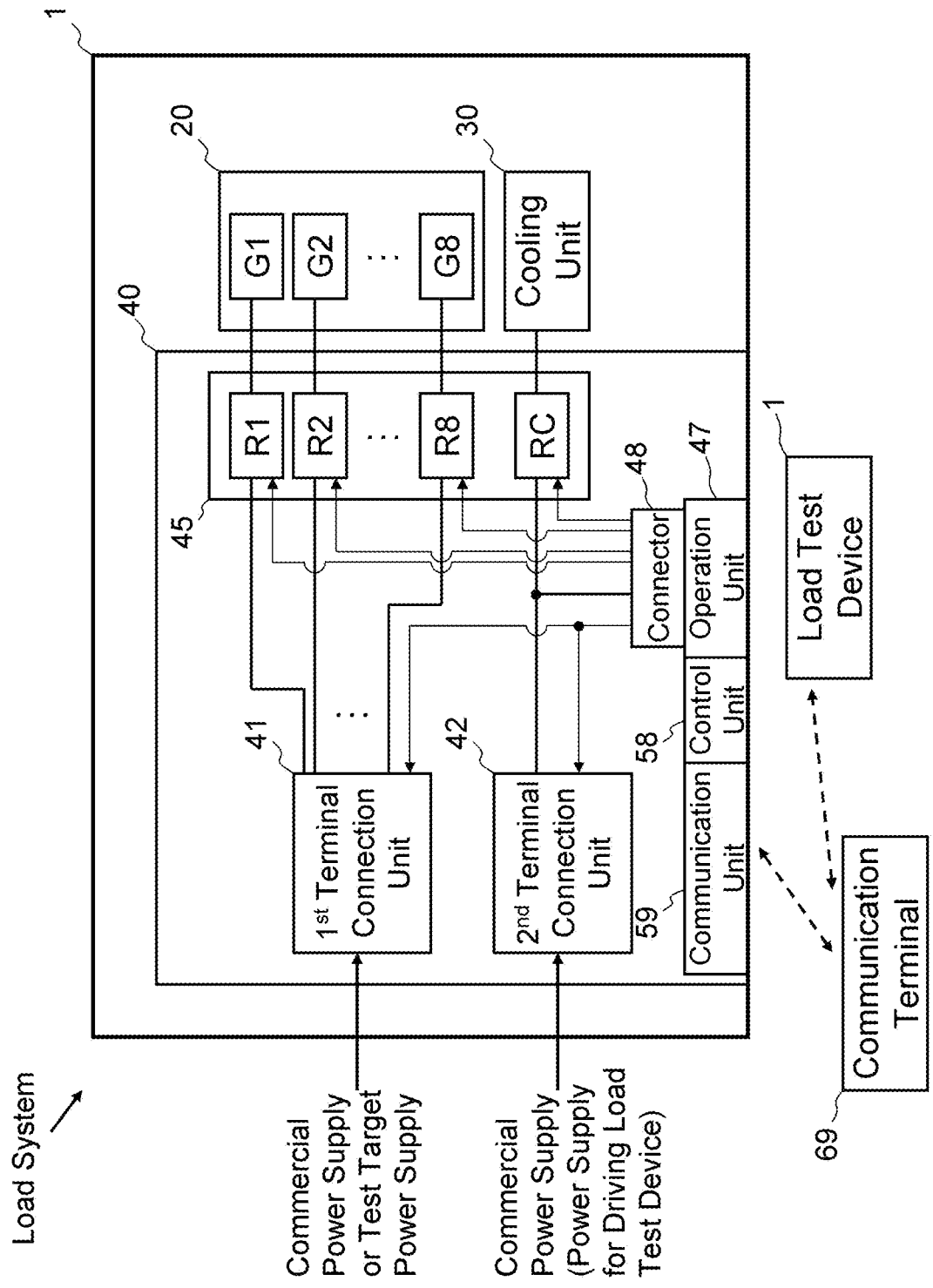
FIG. 10 is a schematic view illustrating a configuration of a load system.
Figure 11:
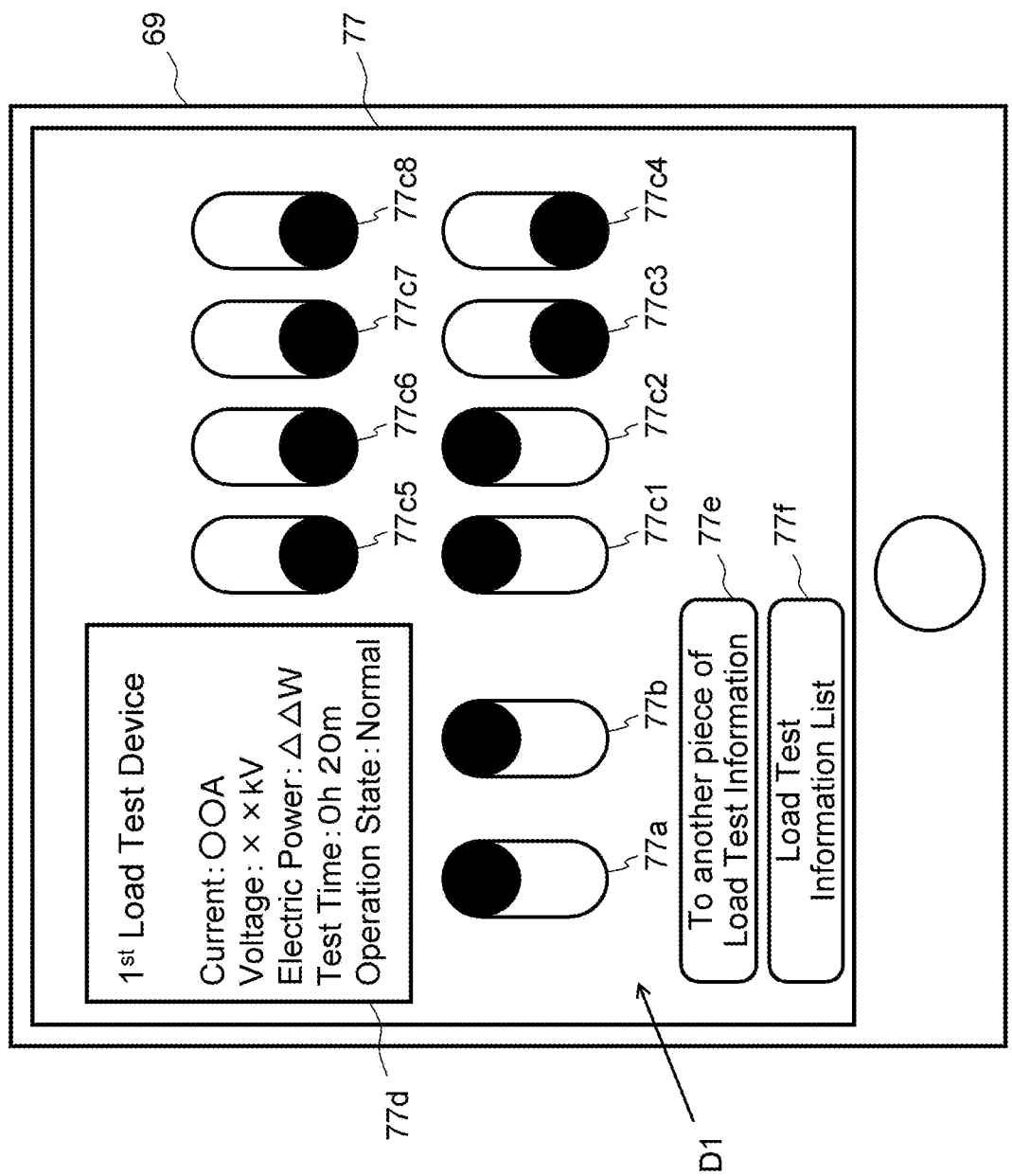
FIG. 11 is a view illustrating an example of on/off state display pattern that is displayed on a display device of a communication terminal.
Figure 12:
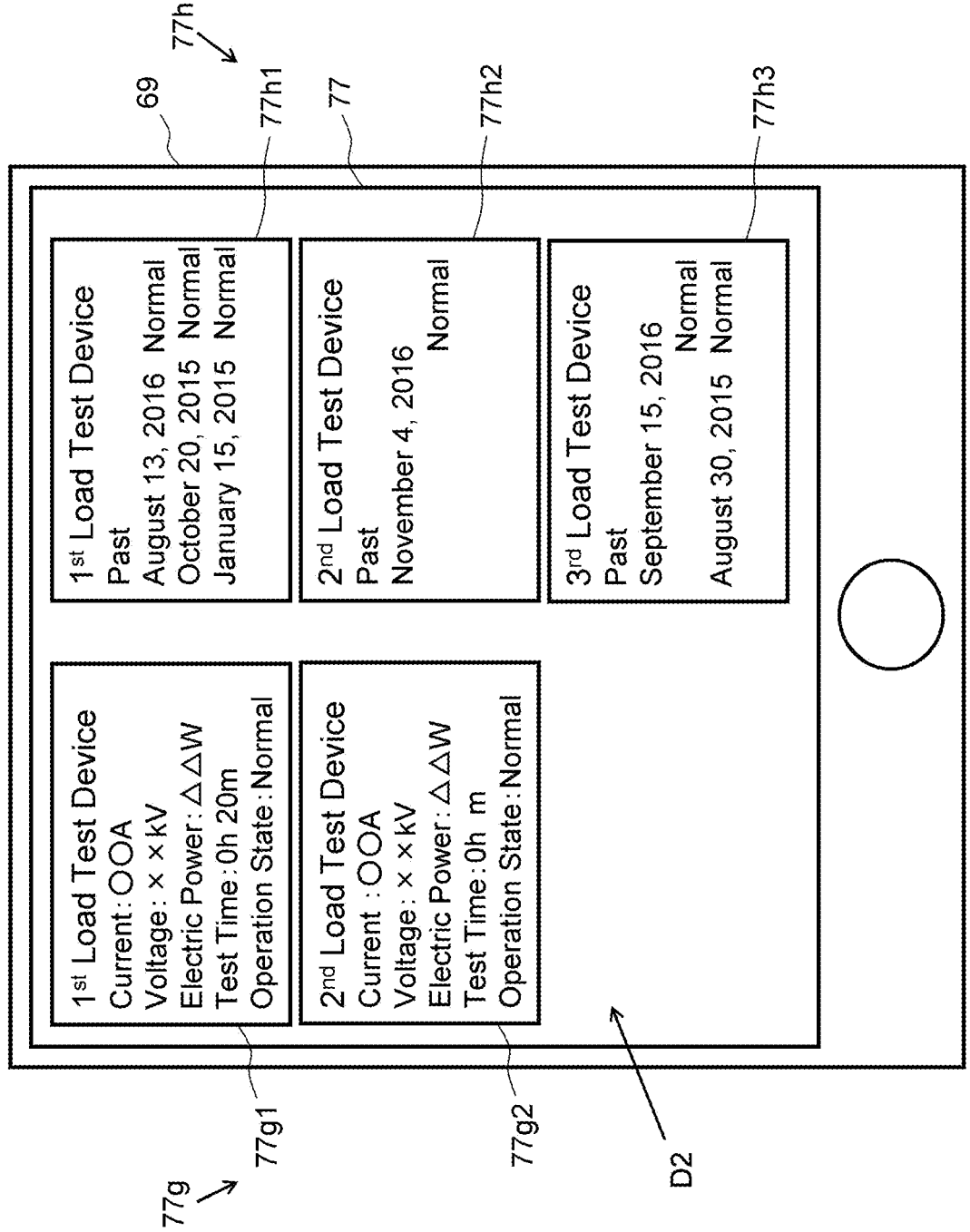
FIG. 12 is a view illustrating an example of a history display pattern that is displayed on the display device of the communication terminal.

With regard to the operation of the operation unit 47, in addition to an aspect in which an operator directly operates switches of the operation unit 47, a communication unit 59 that performs bidirectional wireless communication with an external communication terminal (for example, a portable telephone to which predetermined software is installed) 69 is provided, and the operation unit 47 (a relay that synchronizes with an on/off operation of the operation unit 47) is operated on the basis of an instruction that is given from the communication terminal 69 through a control unit 58 (refer to FIG. 10 to FIG. 12).

In this case, the load test device 1 further includes the control unit 58 and the communication unit 59.

The control unit 58 such as a CPU controls the operation unit 47 and the communication unit 59.

The communication unit (receiver and transmitter) 59 including a storage and a memory, receives a signal related to an instruction for operating the relay corresponding to a switch of the operation unit 47 from the communication terminal 69, and transmits information related to a state of the load test device 1 (an on/off state of the relay, and the like) to the communication terminal 69.

As wireless communication means that can be used in communication between the communication unit 59 and the communication terminal 69, IEEE 802.15.1 (Bluetooth (registered trademark), IEEE 802.11 (wireless LAN), a wireless telephone line, and the like are considered.

Typically, only an operator who is close to the operation unit 47 of the load test device 1 can grasp a state of the load test device 1 and can operate the load test device 1, and an operator who is at a position remote from the load test device 1 cannot grasp the state of the load test device 1 and cannot operate the operation unit 47 of the load test device 1. However, when using the communication terminal 69 that is capable of performing communication with the load test device 1, operator who is at a position remote from the load test device 1 can grasp the state of the load test device 1 and can operate the operation unit 47 (the relay that synchronizes with the on/off operation of the operation unit 47) of the load test device 1.

In addition, a load system including two or more pieces of the load test devices 1 and the communication terminal 69 may be constructed, and the communication terminal 69 may perform wireless communication with the two or more pieces of load test device 1.

The communication terminal 69 communicates with a plurality of the load test devices 1 to operate the operation unit 47 of the plurality of load test devices 1. Accordingly, states of the plurality of load test devices 1 can be simultaneously displayed on one piece of the communication terminal 69, and one operator can operate the plurality of load test devices 1.

Particularly, the above-described configuration is effective for an air-conditioning facility load test (the first load test) that is performed by providing the plurality of load test devices 1.

Specifically, the communication terminal 69 has a display function and an operation function of a touch switch and the like, and includes a display device 77 that displays an on/off state display pattern D1 and a history display pattern D2 during activation of predetermined software.

The on/off state display pattern D1 shows a state of the operation unit 47 in the load test device 1, and includes a power supply state display region 77a that shows an on/off state of a circuit breaker of the first terminal connection unit 41 (a switch state of the power switch 47a), a cooling state display region 77b that shows an on/off state of the cooling fan relay RC (a switch state of the cooling fan switch 47b), a first display region 77c1 to an eighth display region 77c8 which show on/off states of the first relay R1 to the eighth relay R8 which correspond to the first resistor group G1 to the eighth resistor group G8 (switch states of the first resistance switching switch 47c1 to the eighth resistance switching switch 47c8), a load test state display region 77d that shows a load test state (a current value and the like) of the load test device 1, a first switching button region 77e that performs switching to display of the on/off state display pattern D1 corresponding to another load test device, and a second switching button region 77f that performs switching to display of the history display pattern D2.

When the power supply state display region 77a is operated, switching of an on/off state of the circuit breaker and the like (the power switch 47a) of the first terminal connection unit 41 of a corresponding load test device 1 is performed.

When the cooling state display region 77b is operated, switching of an on/off state of the cooling fan relay RC (cooling fan switch 47b) of a corresponding load test device 1 is performed.

When the first display region 77c1 is operated, switching of an on/off state of the first relay R1 (the first resistance switching switch 47c1) of a corresponding load test device 1 is performed.

Similarly, when the second display region 77c2 to the eighth display region 77c8 are operated, switching of on/off states of the second relay R2 to the eighth relay R8 (the second resistance switching switch 47c2 to the eighth resistance switching switch 47c8) of a corresponding load test device is performed.

FIG. 11 illustrates an example of the on/off state display pattern D1 in which the power switch 47a, the cooling fan switch 47b, the first resistance switching switch 47c1, and the second resistance switching switch 47c2 in the load test device 1 (a first load test device) are set to an on-state, and the third resistance switching switch 47c3 to the eighth resistance switching switch 47c8 are set to an off state.

The load test state display region 77d displays a state (numeral values such as a current that flows to the first resistor group G1 to the eighth resistor group G8, a voltage that is applied to the first resistor group G1 to the eighth resistor group G8, an electric power value, a load amount, and a test time, and an operation state indicating whether not an operation is performed normally and the like) of a load test that is performed by a corresponding load test device 1.

When the first switching button region 77e is operated, switching is performed to display of the on/off state display pattern D1 of another load test device 1 that performs communication with the communication terminal 69.

When the second switching button region 77f is operated, switching is performed to display of load test information list (history display pattern D2) of the load test device 1 that has performed communication with the communication terminal 69.

The history display pattern D2 includes an in-progress display region 77g that shows a load test state of the load test device 1 in communication with the communication terminal 69, and a past display region 77h that shows a past load test content (load test date and time, and the like) of the load test device 1 that has performed communication with the communication terminal 69.

FIG. 12 illustrates an example of the history display pattern D2 including two in-progress display regions 77g (77g1 and 77g2) which show a load test state of two pieces of the load test devices 1 (a first load test device and a second load test device) which are in communication with the communication terminal 69, and three past display regions 77h (77h1, 77h2, and 77h3) which show past load test contents of three pieces of the load test device 1 (a first load test device, a second load test device, and a third load test device) which have performed communication with the communication terminal 69.

Figure 13:
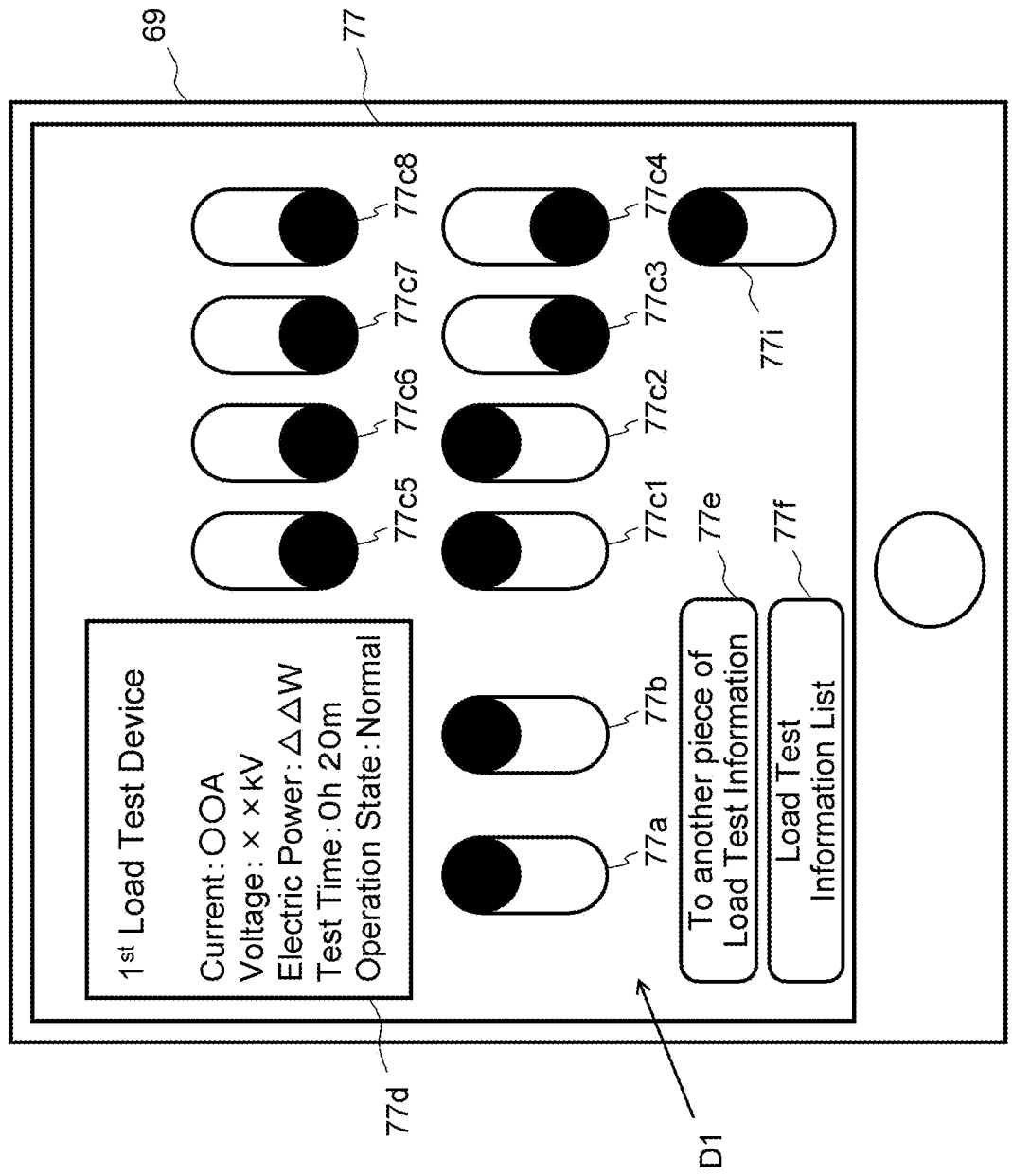
FIG. 13 is a view illustrating an example of the on/off state display pattern to which a use mode switching button region is added.

In addition, a use mode switching button region 77i that performs off control on the basis of a communication state may be provided in the on/off state display pattern D1 (refer to FIG. 13).

In a state set to a mode in which the off control based on the communication state is performed by using the use mode switching button region 77i, in a case where a communication state between the communication unit 59 and the communication terminal 69 is cut off, the control unit 58 sets several pieces (at least one piece) among the first relay R1 to the eighth relay R8, which are set to an on-state, to an off-state to reduce a load.

For example, an aspect in which only a relay corresponding to one resistor group with a small resistance value is set to an on-state and relays corresponding to the other resistor groups are set to an off state is considered.

In addition, to avoid an operation failure due to a rapid load fluctuation, it is preferable to gradually set the relays to an off state one by one, that is, with an interval of a first time t1 (for example, t1=10 seconds) instead of simultaneously setting all of the relays to the off-state.

According to this, electric power is supplied to only a resistor group corresponding to a relay that is set to an on-state from the commercial power supply or the test target power supply through the first terminal connection unit 41.

However, at least one among the relays corresponding to the resistor groups is maintained to an on-state before the passage of a second time t2 (for example, t2=five minutes) after initiation of control of reducing the load without being set to the off-state.

Figure 14:
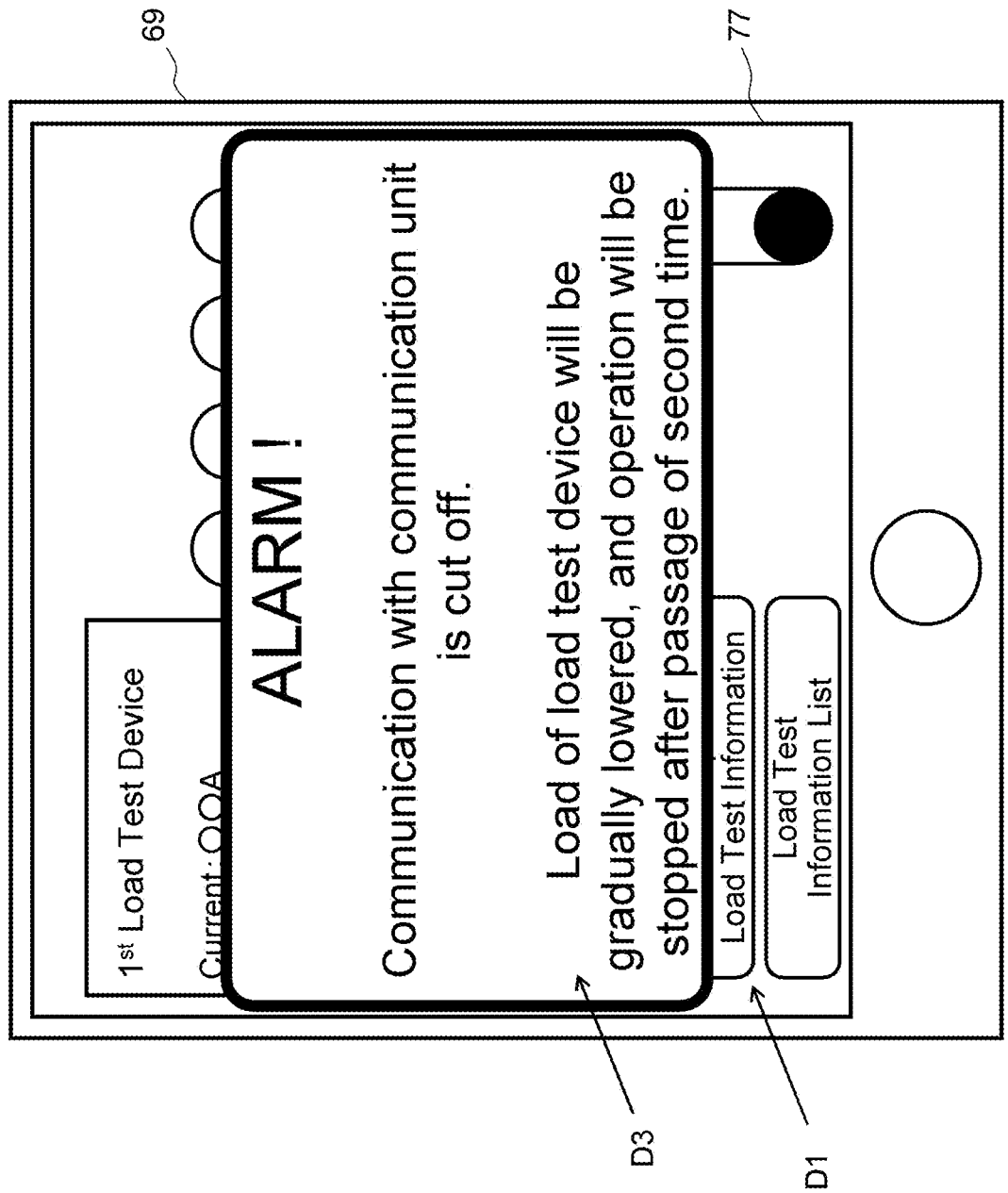
FIG. 14 is a view illustrating an example of an alarm display pattern that is displayed on the display device of the communication terminal.

In addition, the communication terminal 69 displays an alarm display pattern D3 (refer to FIG. 14).

The alarm display pattern D3 outputs characters indicating "cutting-off of communication with a communication unit" and "gradual lowering of the load of the load test device and stoppage of an operation after the passage of the second time t2".

Furthermore, the communication terminal 69 may output a voice indicating "cutting-off of communication with a communication unit" and "gradual lowering of the load of the load test device and stoppage of an operation after the passage of the second time t2" instead of or in addition to the alarm display pattern D3.

In addition, after the second time t2 has passed from the load reduction, the control unit 58 sets the other relays which are set to an on-state still among the first relay R1 to the eighth relay R8 to an off-state to stop electric power supply to the resistance unit 20.

Then, the control unit 58 sets the cooling fan relay RC to an off-state, and terminates the load test.

Figure 15:
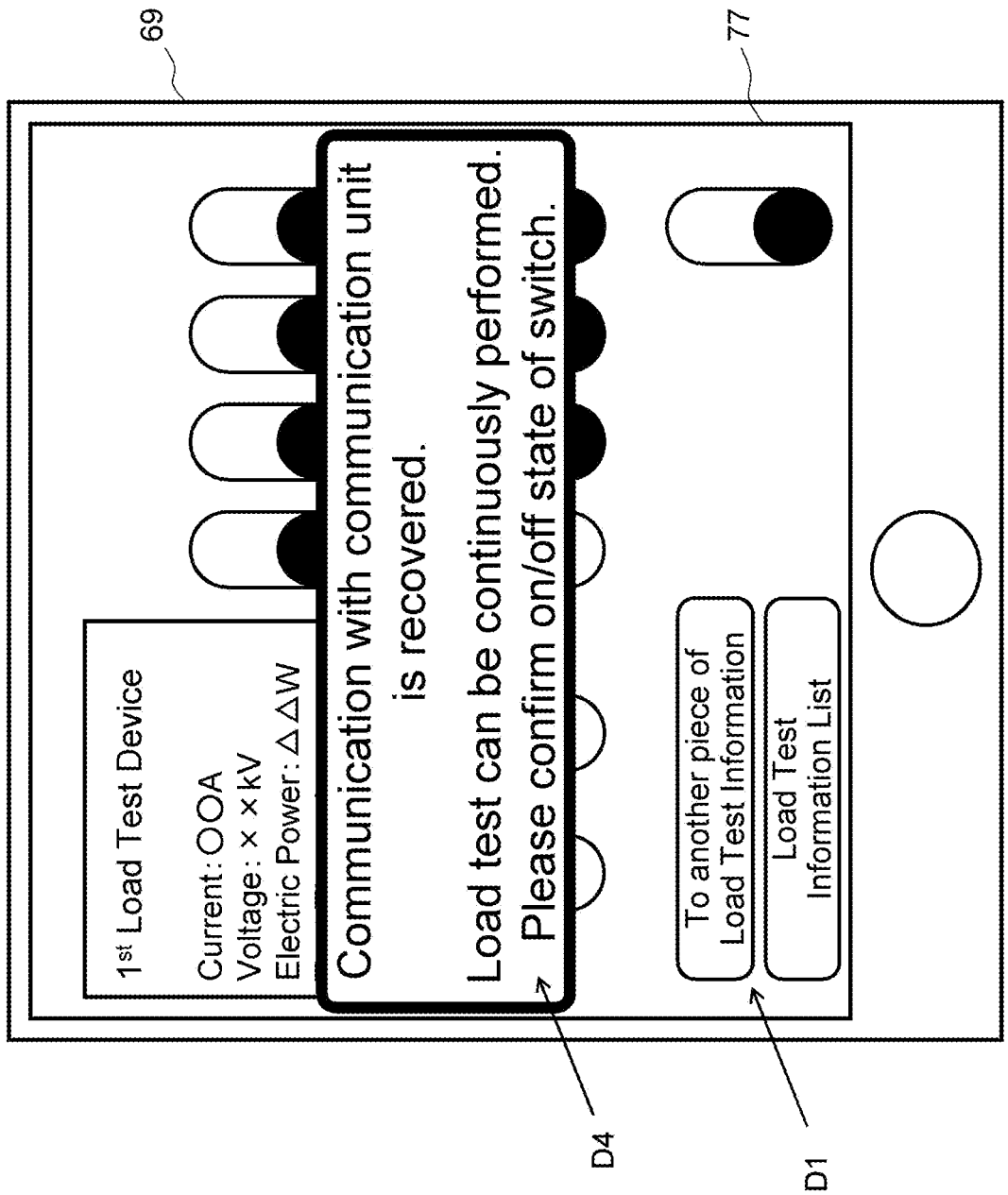
FIG. 15 is a view illustrating an example of a communication recovery display pattern that is displayed on the display device of the communication terminal.

In a case where communication is recovered after communication between the communication unit 59 and the communication terminal 69 is cut off, and before all relays corresponding to the resistor group in the load test device 1 are set to an off-state (before the passage of the second time t2), gradual setting control to the off-state is stopped, and the communication terminal 69 displays a communication recovery display pattern D4 including information related to the communication recovery (refer to FIG. 15).

The communication recovery display pattern D4 outputs characters indicating "communication with a communication unit is recovered", "continuation of a load test is possible", and "(since an on/off state of a switch varies due to the gradual off control), please confirm an on/off state of a switch".

Furthermore, the communication terminal 69 may output voices indicating "communication with a communication unit is recovered", "continuation of a load test is possible", and "(since an on/off state of a switch varies due to the gradual off control), please confirm an on/off state of a switch" instead of or in addition to the communication recovery display pattern D4.

Furthermore, the interruption display of the alarm display pattern D3 and the communication recovery display pattern D4 are terminated after a predetermined operation (for example, touching of a region in which the alarm display pattern D3 is interrupt-displayed, and the like) or after the passage of a third time t3 (for example, t3=30 seconds) after the interruption display is initiated.

In addition, the communication terminal 69 receives information related to the on/off state of the respective relays in the load test device 1, and updates the on/off state display pattern D1.

In a case where communication between the communication unit 59 and the communication terminal 69 is cut off, it is difficult to control a load state and the like of the load test device 1 through an operation by the communication terminal 69, but it is possible to secure safety of the load test device 1 by lowering a load on the basis of the communication cutting-off.

In addition, the load test continues at a low load before the second time t2 has passed after the lowering of the load, and thus a load test at a high load can be restarted by raising the load through an operation of the operation unit 47 by an operator or through an operation of the communication terminal 69 by the operator after the recovery of the communication state.

Figure 16:
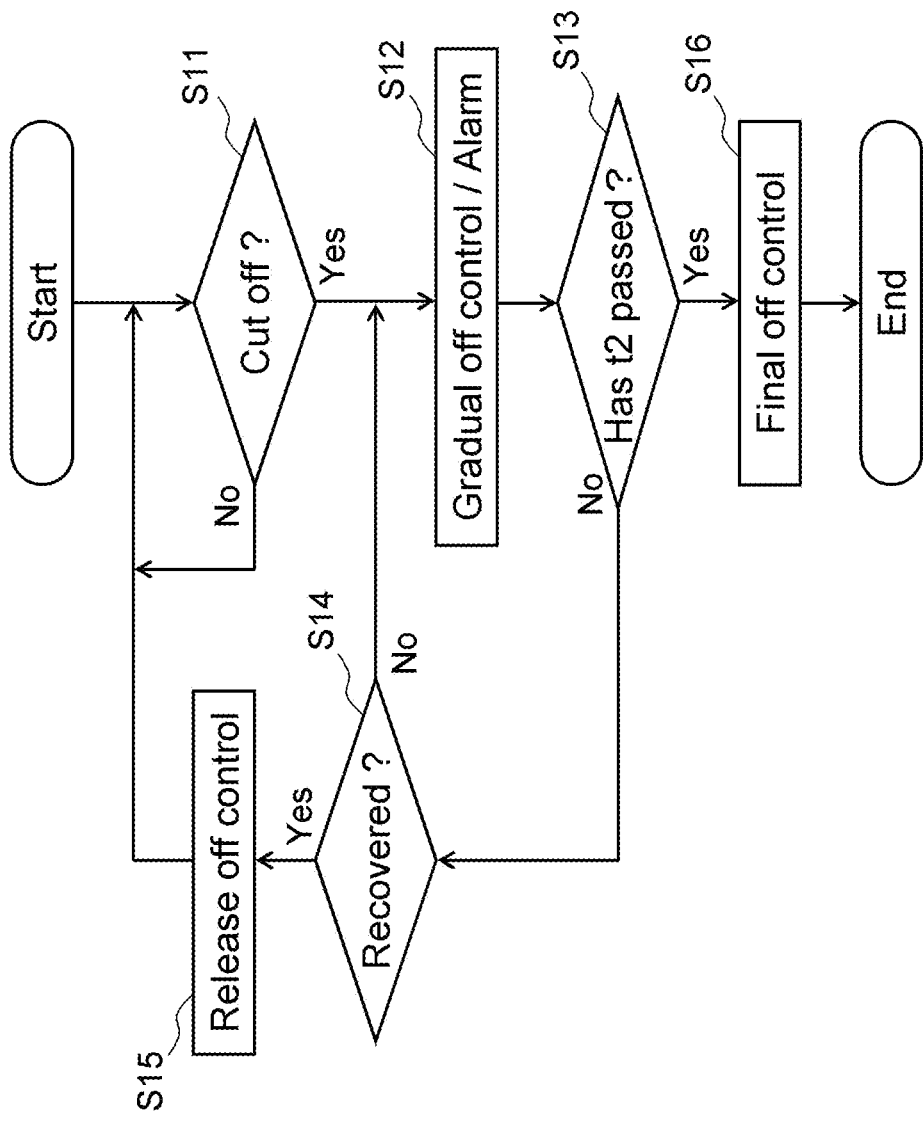
FIG. 16 is a flowchart illustrating an example of a procedure of a gradual off control based on communication disconnection.

An example of a procedure of the gradual off control based on the communication cutting-off will be described with reference to a flowchart of FIG. 16.

In step S11, the control unit 58 determines whether or not a communication state between the communication unit 59 and the communication terminal 69 is cut off for a fourth time t4 or longer (for example, t4=10 seconds).

In a case where the communication is cut off, the processing proceeds to step S12, and in a case where the communication is not cut off, the determination in step S11 is performed again after the passage of a fifth time t5 (for example, t5=five seconds).

The control unit 58 performs gradual off control in step S12.

Specifically, the control unit 58 sets one relay among relays which correspond to a resistor group and are set to an on-state, to an off-state.

However, in a case where a number of relays which are set to the on-state, among the relays corresponding to the resistor groups becomes a predetermined value (for example, one), the remaining on-state relay is not set to the off-state, and the processing proceeds to step S13.

In addition, in a case where the communication state between the communication unit 59 and the communication terminal is cut off for the fourth time t4 or longer, the communication terminal 69 displays the alarm display pattern D3.

After the passage of the first time t1 from step S12, in step S13, the control unit 58 determines whether or not the second time t2 has passed after performing the gradual off control in step S12.

In a case where the second time t2 has passed, the processing proceeds to step S16, and in a case where the second time t2 has not passed, the processing proceeds to step S14.

In step S14, the control unit 58 determines whether or not the communication state between the communication unit 59 and the communication terminal 69 is recovered, that is, whether or not it enters a state in which communication between the communication unit 59 and the communication terminal 69 is possible.

In a case where the communication state is recovered, the processing proceeds to step S15, and in a case where the communication state is not recovered, the processing proceeds to step S12.

In step S15, the control unit 58 releases the gradual off control, and the communication terminal 69 displays the communication recovery display pattern D4.

In step S16, the control unit 58 sets a predetermined number of remaining on-state relays to an off-state, and terminates the processing.

In a state set to a mode in which the off control based on the communication state is not performed by using the use mode switching button region 77i, in a case where a communication state between the communication unit 59 and the communication terminal 69 is cut off, the load test can continue without performing the above-described off control (off control of gradually reducing a load and finally stopping the load test device 1) by the control unit 58, and alarm outputting by the communication terminal 69.

REFERENCE SIGNS LIST

1 LOAD TEST DEVICE
10 HOUSING
10a FIRST SIDE SURFACE
10b SECOND SIDE SURFACE
10c UPPER SURFACE
10d LOWER SURFACE
10e FRONT SURFACE
10f REAR SURFACE
11 FIRST REGION
12 SECOND REGION
13 COVER
13a FIRST SIDE SURFACE COVER
13b SECOND SIDE SURFACE COVER
13c UPPER SURFACE COVER
13d LOWER SURFACE COVER
20 RESISTANCE UNIT
30 COOLING UNIT
40 CONNECTION SWITCHING UNIT
41 FIRST TERMINAL CONNECTION UNIT
42 SECOND TERMINAL CONNECTION UNIT
45 RELAY UNIT
474 OPERATION UNIT
47a POWER SWITCH
47b COOLING FAN SWITCH
47c RESISTANCE SWITCHING SWITCH
47c1 to 47c8 FIRST RESISTANCE SWITCHING SWITCH TO EIGHTH RESISTANCE SWITCHING SWITCH
47d DISPLAY UNIT
471 HOUSING
473 CONCAVE PORTION
48 CONNECTOR
49a FIRST ATTACHMENT HOLE
49b SECOND ATTACHMENT HOLE
50 INSTALLATION MEMBER
51 RACK ATTACHMENT BRACKET
53 KNOB
54 CASTER
58 CONTROL UNIT
59 COMMUNICATION UNIT
69 COMMUNICATION TERMINAL
77a POWER SUPPLY STATE DISPLAY REGION
77b COOLING STATE DISPLAY REGION
77c1 to 77c8 FIRST DISPLAY REGION TO EIGHTH DISPLAY REGION
77d LOAD TEST STATE DISPLAY REGION
77e FIRST SWITCHING BUTTON REGION
77f SECOND SWITCHING BUTTON REGION
77g IN-PROGRESS DISPLAY REGION
77h PAST DISPLAY REGION
77i USE MODE SWITCHING BUTTON REGION
90 SERVER RACK
D1 ON/OFF STATE DISPLAY PATTERN
D2 HISTORY DISPLAY PATTERN
D3 ALARM DISPLAY PATTERN
D4 COMMUNICATION RECOVERY DISPLAY PATTERN
G1 to G8 FIRST RESISTOR GROUP TO EIGHTH RESISTOR GROUP
R1 to R8 FIRST RELAY TO EIGHTH RELAY
RC COOLING FAN RELAY
Re RESISTOR
t1 FIRST TIME (TIME INTERVAL FOR GRADUALLY REDUCING LOAD)
t2 SECOND TIME (TIME UNTIL ALL RELAYS CORRESPONDING TO RESISTOR GROUP ARE SET TO OFF-STATE)
t3 THIRD TIME (TIME UNTIL INTERRUPTION DISPLAY IS TERMINATED)
t4 FOURTH TIME (TIME FOR WHICH COMMUNICATION STATE IS CONTINUOUSLY CUT OFF)
t5 FIFTH TIME (TIME INTERVAL FOR MAKING DETERMINATION IN STEP S11)

The invention claimed is:

1. A load test device comprising:
a resistance unit that includes a plurality of resistor groups, wherein each of the resistor groups includes at least one resistor; and
a communication unit that performs wireless communication with a communication terminal, wherein:
voltage application from a power supply to the resistance unit is performed as a load test while changing a number of the resistor groups to be employed for the load test in the resistance unit;
the communication unit transmits information related to an on/off state of the load test device to the communication terminal, and receives a signal related to an instruction for operating the load test device from the communication terminal; and
in response to a condition where communication between the communication unit and the communication terminal is cut off, at least one of relays among the load test device, which correspond to the plurality of resistor groups in the resistance unit and are set to an on-state, is set to an off-state.

2. A load system comprising:
a first load test device that includes a first resistance unit having a plurality of resistor groups, wherein each of the resistor groups includes at least one resistor;
a second load test device that is different from the first load test device and includes a second resistance unit having a plurality of resistor groups, wherein each of the resistor group includes at least one resistor; and
a communication terminal that performs wireless communication with the first load test device and the second load test device, wherein
voltage application from a power supply to the first resistance unit is performed as a load test by the first load test device while changing a number of the resistor groups to be employed for the load test in the first resistance unit,
voltage application from a power supply to the second resistance unit is performed as a load test by the second load test device while changing a number of the resistor groups to be employed for the load test in the second resistance unit,
the first load test device and the second load test device are used to perform at least one of a load test of an air-conditioning facility that cools down a computer server, a load test of a generator, and a load test of a battery,
the first load test device includes a first communication unit that performs wireless communication with the communication terminal,
the second load test device includes a second communication unit that performs wireless communication with the communication terminal,
the first communication unit transmits information related to an on/off state of the first load test device to the communication terminal through wireless communication, and receives a signal related to an instruction for operating the first load test device from the communication terminal through wireless communication, and the second communication unit transmits information related to an on/off state of the second load test device to the communication terminal through wireless communication, and receives a signal related to an instruction for operating the second load test device from the communication terminal through wireless communication.

3. The load system according to claim 2, wherein software configured to display a first on/off state display pattern and a second on/off state display pattern is installed in the communication terminal, the first on/off state display pattern includes a first relay on/off state display region that shows an on/off state of at least relays corresponding to the plurality of resistor groups in the first resistance unit among the relays in the first load test device, and a first load test state display region that shows a load test state of the first load test device, the second on/off state display pattern includes a second relay on/off state display region that shows an on/off state of at least relays corresponding to the plurality of resistor groups in the second resistance unit among the relays in the second load test device, and a second load test state display region that shows a load test state of the second load test device, switching of the on/off state of at least relays corresponding to the plurality of resistor groups in the first resistance unit among the relays in the first load test device is performed in correspondence with an operation of the first relay on/off state display region, switching of the on/off state of at least relays corresponding to the plurality of resistor groups in the second resistance unit among the relays in the second load test device is performed in correspondence with an operation of the second relay on/off state display region, the load test state of the first load test device includes at least one piece of information among information related to a current, information related to a voltage, information related to electric power, information related to a load amount, information related to a test time, and information indicating whether or not an operation is performed normally in the load test of the first load test device, and the load test state of the second load test device includes at least one piece of information among information related to a current, information related to a voltage, information related to electric power, information related to a load amount, information related to a test time, and information related to whether or not an operation is performed normally in the load test of the second load test device.

4. A load system comprising:

a first load test device;

a second load test device that is different from the first load test device; and a communication terminal that performs wireless communication with the first load test device and the second load test device, wherein the first load test device includes a first communication unit that performs wireless communication with the communication terminal, the second load test device includes a second communication unit that performs wireless communication with the communication terminal, the first communication unit transmits information related to an on/off state of the first load test device to the communication terminal, and receives a signal related to an instruction for operating the first load test device from the communication terminal, the second communication unit transmits information related to an on/off state of the second load test device to the communication terminal, and receives a signal related to an instruction for operating the second load test device from the communication terminal, software configured to display a first on/off state display pattern and a second on/off state display pattern is installed in the communication terminal, the first on/off state display pattern includes a first relay on/off state display region that shows an on/off state of a relay in the first load test device, and a first load test state display region that shows a load test state of the first load test device, the second on/off state display pattern includes a second relay on/off state display region that shows an on/off state of a relay in the second load test device, and a second load test state display region that shows a load test state of the second load test device, switching of the on/off state of the relay in the first load test device is performed in correspondence with an operation of the first relay on/off state display region, switching of the on/off state of the relay in the second load test device is performed in correspondence with an operation of the second relay on/off state display region, the load test state of the first load test device includes at least one piece of information among information related to a current, information related to a voltage, information related to electric power, information related to a load amount, information related to a test time, and information indicating whether or not an operation is performed normally in the load test of the first load test device, the load test state of the second load test device includes at least one piece of information among information related to a current, information related to a voltage, information related to electric power, information related to a load amount, information related to a test time, and information related to whether or not an operation is performed normally in the load test of the second load test device, the software is configured to further display a history display pattern, the history display pattern includes an in-progress display region that shows a load test state of the first load test device and a load test state of the second load test device, and a past display region that shows a past load test content in the first load test device and the second load test device, the past load test content in the past display region includes information related to date and time in the past load test, in a case where a region that shows the load test state of the first load test device in the in-progress display region is operated, switching to display of the first on/off state display pattern is performed, and in a case where a region that shows the load test state of the second load test device in the in-progress display region is operated, switching to display of the second on/off state display pattern is performed.

5. A load test device that includes a communication unit that performs wireless communication with a communication terminal, and is used to perform at least one of a load test of an air-conditioning facility that cools down a computer server, a load test of a generator, and a load test of a battery, wherein the communication unit transmits information related to an on/off state of the load test device to the communication terminal through wireless communication, and receives a signal related to an instruction for operating the load test device from the communication terminal through wireless communication, the load test device includes a resistance unit having a plurality of resistor groups, wherein each of the resistor groups includes at least one resistor, voltage application from a power supply to the resistance unit is performed as the load test while changing a number of the resistor groups to be employed for the load test in the resistance unit, software configured to display an on/off state display pattern is installed in the communication terminal, the on/off state display pattern includes a relay on/off state display region that shows an on/off state of at least relays corresponding to the plurality of resistor groups in the resistance unit among the relays in the load test device, and a load test state display region that shows a load test state of the load test device, and switching of the on/off state of at least relays corresponding to the plurality of resistor groups in the resistance unit among the relays in the load test device is performed in correspondence with an operation of the relay on/off state display region.

6. A load test device comprising:

a resistance unit including a plurality of resistor groups, wherein each of the resistor group includes at least one resistor; and a communication unit that performs wireless communication with a communication terminal, wherein voltage application from a power supply to the resistance unit is performed as a load test while changing a number of the resistor groups to be employed for the load test in the resistance unit;

the communication unit transmits information related to an on/off state of the load test device to the communication terminal, and receives a signal related to an instruction for operating the load test device from the communication terminal, and in response to a condition where communication between the communication unit and the communication terminal is cut off, a plurality of relays among the load test device, which corresponds to the plurality of resistor groups in the resistance unit and is set to an on-state, is gradually set to an off-state.

7. The load test device according to claim 6, wherein in a case where the communication is recovered after the communication is cut off, and before all of the relays corresponding to the plurality of resistor groups in the load test device are set to the off-state, the gradual setting control to the off-state is stopped.

* * * * *